US006993703B2

(12) United States Patent
Miyauchi

(10) Patent No.: US 6,993,703 B2
(45) Date of Patent: Jan. 31, 2006

(54) DECODER AND DECODING METHOD

(75) Inventor: Toshiyuki Miyauchi, Tokyo (JP)

(73) Assignee: Sony Corporation, Tokyo (JP)

( * ) Notice: Subject to any disclaimer, the term of this patent is extended or adjusted under 35 U.S.C. 154(b) by 533 days.

(21) Appl. No.: 09/875,310

(22) Filed: Jun. 6, 2001

(65) Prior Publication Data

US 2002/0040461 A1 Apr. 4, 2002

(30) Foreign Application Priority Data

Jun. 8, 2000 (JP) ............................. 2000-172681

(51) Int. Cl.
*H03M 13/03* (2006.01)
(52) U.S. Cl. ..................................... 714/794; 714/795
(58) Field of Classification Search ................ 714/794, 714/795, 759; 375/262, 341
See application file for complete search history.

(56) References Cited

U.S. PATENT DOCUMENTS 6,393,076 B1 * 5/2002 Dinc et al. .................. 375/341

OTHER PUBLICATIONS

S. Benedetto, D. Divsalar, G. Montorsi, and F. Pollara, Soft-Output Decoding Algorithms in Iterative Decoding of Turbo Codes, TDA Progress Report 42-124, NASA Code 315-91-20-20-53.*
S. Benedetto, D. Divsalar, G. Montorsi, and F. Pollara, A Soft-Input Soft-Output Maximum A Posteriori (MAP) Module to Decod Parallel and Serial Concatenated Codes, TDA Progress Report 42-127, NASA Code 315-91-20-20-53.*
Robertson, P.; Villebrun, E.; Hoeher, P.; A comparison of optimal and sub-optimal MAP decoding algorithms operating in the lo domain, IEEE International Conference on Communications, vol.: 2, Jun. 18-22, 1995, Page(s): 1009-1013.*
Jah-Ming Hsu; Chin-Liang Wang; On finite-precision implementation of a decoder for turbo codes; Proceedings of the 1999 IEEE International Symposium on Circuits and Systems, vol.: 4, May 30-Jun. 2, 1999, Page(s): 423-426.*
Cheng J-F et al: "Linearly Approximated Log-MAP Algorithms for Turbo Decoding" VTC 2000-Spring. 2000 IEEE 51st. Vehicular Technology Conference Proceedings. Tokyo, Japan, May 15-18, 2000, IEEE Vehicular Technology Conference, New York, NY: IEEE, US, vol. 3 of 3. Conf. 51, May 15, 2000, pp. 2252-2256, XP000968405 ISBN: 0-7803-5719-1.
"Simplified Log-MAP Algorithm" Research Disclosure, Kenneth Mason Publications, Hampshire, GB, No. 421, May 1999, p. 612 XP000888685 ISSN: 0374-4353.

* cited by examiner

*Primary Examiner*—Joseph D. Torres
(74) *Attorney, Agent, or Firm*—Frommer Lawrence & Haug LLP; William S. Frommer; Darren M. Simon

(57) ABSTRACT

A decoder for performing log-sum corrections by means of a linear approximation, putting stress on speed, with a reduced circuit dimension without adversely affecting the decoding performance of the circuit. The decoder includes a linear approximation circuit that computes the log-sum corrections using the function F=−a P−Q+b, where the coefficient −a represents the gradient of the function and the coefficient b represents, the intercept and are expressed by a power exponent of 2.

24 Claims, 14 Drawing Sheets

DECODER AND DECODING METHOD

BACKGROUND OF THE INVENTION

1. Field of the Invention

This invention relates to a decoder and a decoding method adapted to soft-output decoding.

2. Related Background Art

There have been many studies in recent years for minimizing symbol error rates by obtaining soft-outputs for the decoded outputs of inner codes of concatenated codes or the outputs of recursive decoding operations using a recursive decoding method. There have also been studies for developing decoding methods that are adapted to producing soft-outputs. For example, Bahl, Cocke, Jelinek and Raviv, "Optimal decoding of linear codes for minimizing symbol error rates", IEEE Trans. Inf. Theory, vol. It-20, PP. 284–287, March 1974 describes an algorithm for minimizing symbol error rates when decoding predetermined codes such as convolutional codes. The algorithm will be referred to as BCJR algorithm hereinafer. The BCJR algorithm is designed to output not each symbol but the likelihood of each symbol as a result of decoding operation. Such an outputs is referred to as soft-output. The BCJR algorithm will be discussed below firstly by referring to FIG. 1. It is assuemd that digital information is put into convolutional codes by encoder 201 of a transmitter (not shown), whose output is then input to a receiver (not shown) by way of a memoryless channel 202 having noises and decoded by decoder 203 of the receiver for observation.

The M states (transitional states) representing the contents of the shift registers of the encoder 201 are denoted by integer m (m=0, 1, . . . , M−1) and the state at time t is denoted by $S_t$. If information of k bits is input in a time slot, the input at time t is expressed by means of $i_t=(i_{t1}, i_{t2}, \ldots, i_{tk})$ and the input system is expressed by means of $I_1^T(i_1, i_2, \ldots, i_T)$. If there is a transition from state m' to state m, the information bits corresponding to the transition are expressed by means of $i(m', m)=(i_1(m', m), i_2(m', m), \ldots, i_k(m', m))$. Additionally, if a code of n bits is output in a time slot, the output at time t is expressed by means of $x_t=(x_{t1}, x_{t2}, \ldots, x_{tn})$ and the output system is expressed by means of $X_1^T=(x_1, x_2, \ldots, x_T)$. If there is a transition from state m' to state m, the information bits corresponding to the transition are expressed by means of $x(m', m)=(x_1(m', m), x_2(m', m), \ldots, x_k(m', m))$.

The encoder 201 starts to produce convolutinal codes at state $S_0=0$ and ends at state $S_T=0$ after outputting $X_1^T$. The inter-state transition probabilities $P_t(m|m')$ of the above encoder are defined by formula (1) below;

$$P_t(m|m')=Pr\{S_t=m|S_{t-1}=m'\} \quad (1)$$

where Pr {A|B} at the right side of the above equation represents the conditional probability with which A occurs under the conditions in which B occurs. The transition probabilities $P_t(m|m')$ are equal to the probability Pr $\{i_t=i\}$ that input it at time t is equal to i when a transition from state m' to state m occurs with input i as shown by formula (2) below.

$$P_t(m|m')=Pr\{i_t=i\} \quad (2)$$

The memoryless channel 202 having noises receives $X_1^T$ as input and outputs $Y_1^T$. If a received value of n bits is output in a time slot, the output at time t is expressed by means of $y_t=(y_{t1}, y_{t2}, \ldots, y_{tk})$ and the output system is expressed by means of $Y_1^T=(y_1, y_2, \ldots, y_T)$. Then, the transition probabilities of the memoryless channel 202 having noises can be defined for all values of t ($1 \leq t \leq T$) by using the transition probability of each symbol, or $Pr\{y_j|x_j\}$.

$$Pr\{Y_1^t|X_1^t\} = \prod_{j=1}^{t} Pr\{y_j|x_j\} \quad (3)$$

Now, $\lambda_{tj}$ is defined by formula (4) below as the likelihood of input information at time t when $Y_1^T$ is received, or the soft-output to be obtained.

$$\lambda_{tj} = \frac{Pr\{i_{tj} = 1|Y_1^T\}}{Pr\{i_{tj} = 0|Y_1^T\}} \quad (4)$$

With the BCJR algorithm, probabilities $\alpha_t$, $\beta_t$ and $\gamma_t$ are defined respectively by means of formulas (5) through (7) below. Note that Pr{A;B} represents the probability with which both A and B occur.

$$\alpha_t(m)=Pr\{S_t=m;Y_1^T\} \quad (5)$$

$$\beta_t(m)=Pr\{Y_{t+1}^T|S_t=m\} \quad (6)$$

$$\gamma_t(m',m)=Pr\{S_t=m;y_t|S_{t-1}=m'\} \quad (7)$$

Now, the probabilities of $\alpha_t$, $\beta_t$ and $\gamma_t$ will be described by referring to FIG. 2, which is a trellis diagram, or a state transition diagram, of the encoder 201. Referring to FIG. 2, $\alpha_{t-}$ corresponds to the passing probability of each state at time t−1 as computed on a time series basis from the state of starting the coding $S_0=0$ by using the received value and $\beta_t$ corresponds to the passing probability of each state at time t as computed on an inverse time series basis from the state of ending the coding $S_T=0$ by using the received value, while $\gamma_t$ corresponds to the reception probability of the output of each branch showing a transition from a state to another at time t as computed on the basis of the received value and the input probability.

Then, the soft-output $\lambda_{tj}$ is expressed in terms of the probabilities $\alpha_t$, $\beta_t$ and $\gamma_t$ in a manner as shown in formula (8) below.

$$\lambda_{tj} = \frac{\sum\limits_{\substack{m',m \\ i_j(m',m)=1}} \alpha_t(m')\gamma_t(m',m)\beta_t(m)}{\sum\limits_{\substack{m',m \\ i_j(m',m)=0}} \alpha_t(m')\gamma_t(m',m)\beta_t(m)} \quad (8)$$

Meanwhile, formula (9) below holds true for t 1, 2, . . . , T.

$$\alpha_t(m) = \sum_{m'=0}^{M-1} \alpha_{t-1}(m')\gamma_t(m',m) \quad (9)$$

where $\alpha_0(0) = 1, \alpha_0(m) = 0 (m \neq 0)$

Similarly, formula (10) holds true also for t 1, 2, . . . , T.

$$\beta_t(m) = \sum_{m'=0}^{M-1} \beta_{t+1}(m')_{t+1}(m, m') \quad (10)$$

where $\beta_T(0) = 1, \beta_T(m) = 0 (m \neq 0)$

Finally, formula (11) holds true for $\gamma_t$.

$$\gamma_t(m', m) = \begin{cases} P_t(m|m') \cdot Pr\{y_t|x(m', m)\} \\ = Pr\{i_t = i(m', m)\} \cdot Pr\{y_t|x(m', m)\} \\ : *1 \\ 0 : *2 \end{cases} \quad (11)$$

: *1 ... when a transition occurs from $m'$ to $m$ with input $i$.

: *2 ... when no transition occurs from $m'$ to $m$ with input $i$.

Thus, for soft-output decoding, applying the BCJR algorithm, the decoder 203 determines the soft-output $\lambda_t$ by passing through the steps shown in FIG. 3, utilizing the above relationships.

More specifically, in Step S201, the decoder 203 computes the probabilities $\alpha_1(m)$ and $\gamma_t(m', m)$, using the formulas (9) and (11) above, each time it receives $y_t$.

Then, in Step S202, after receiving all the system $Y_1^T$, the decoder 203 computes the probability $\beta_t(m)$ of state m for all values of time t, using the formula (10) above.

Thereafter, in Step S203, the decoder 203 computes the soft-output $\lambda_t$ at each time t by substituting the values obtained in Steps S201 and S202 for the probabilities $\alpha_t$, $\beta_t$ and $\gamma_t$ in the formula (8) above.

With the above described processing steps, the decoder 203 can carry out the soft-output decoding, applying the BCJR algorithm.

However, the BCJR algorithm is accompanied by a problem that it involves a large volume of computational operations because it requires to directly hold probabilities as values to be used for computations and employ multiplications. As an attempt for reducing the volume of computational operations, Robertson, Villebrun and Hoeher, "A Comparison of Optimal and sub-optimal MAP decoding algorithms operating in the domain", IEEE Int. Conf. On Communications, pp. 1009–1013, June 1995, proposes Max-Log-MAP Algorithm and Log-MAP Algorithm (to be referred to as Max-Log-BCJR algorithm and Log-BCJR algorithm respectively hereinafter).

Firstly, Max-Log-BCJR algorithm will be discussed below. With the Max-Log-BCJR algorithm, the probabilities $\alpha_t$, $\beta_t$, and $\gamma_t$ are expressed in terms of natural logarithm so that the multiplications for determining the probabilities are replaced by a logarithmic addition as expressed by formula (12) below and the logarithmic addition is approximated by a logarithmic maximizing operation as expressed by formula (13) below. Note that in the formula (13), max (x, y) represents a function for selecting either x and y that has a larger value.

$$\log(e^x \cdot e^y) = x+y \quad (12)$$

$$\log(e^x + e^y) = \max(x,y) \quad (13)$$

For simplification, the natural logarithm is expressed by means of I and values $\alpha_t$, $\beta_t$, $\gamma_t$ and $\lambda_t$ are expressed respectively by means of $I\alpha_t$, $I\beta_t$, $I\gamma_t$ and $I\gamma_t$ in the domain of the natural logarithm as shown in formula (14) below.

$$\begin{cases} I\alpha_t(m) = \log(\alpha_t(m)) \\ I\beta_t(m) = \log(\beta_t(m)) \\ I\gamma_t(m) = \log(\gamma_t(m)) \\ I\lambda_t = \log\lambda_t \end{cases} \quad (14)$$

With the Max-Log-BCJR algorithm, the log likelihoods $I\alpha_t$, $I\beta_t$, $I\gamma_t$ are approximated by using formulas (15) through (17) below. Note that the maximum value max in state m' at the right side of the equation of (15) is determined in state m' showing a transition to state m. Similarly, the maximum value max in state m' at the right side of the equation of (16) is determined in state m' showing a transition to state m.

$$I\alpha_t(m) \cong \max_{m'}(I\alpha_{t-1}(m') + I\gamma_t(m', m)) \quad (15)$$

$$I\beta_t(m) \cong \max_{m'}(I\beta_{t+1}(m') + I\gamma_{t+1}(m', m)) \quad (16)$$

$$I\gamma_t(m', m) = \log(Pr\{i_t = i(m', m)\}) + \log(Pr\{y_t|x(m', m)\}) \quad (17)$$

With the Max-Log-BCJR algorithm, logarithmic soft-output $I\lambda_t$ is also approximated by using formula (18) below. Note that, in the equation of (18), the maximum value max of the first term at the right side is determined in state m' showing a transition to state mn when "1" is input and the maximum value max of the second term at the right side of the above equation is determined in state m' showing a transition to state m when "0" is input.

$$I\lambda_{ij} \cong \max_{\substack{m',m \\ i_j(m',m)=1}} (I\alpha_{t-1}(m') + I\gamma_t(m', m) + I\beta_t(m)) - \quad (18)$$

$$\max_{\substack{m',m \\ i_j(m',m)=0}} (I\alpha_{t-1}(m') + I\gamma_t(m', m) + \beta_t(m))$$

Thus, for soft-output decoding, applying the Max-Log-BCJR algorithm, the decoder 203 determines soft-output $\lambda_t$ by passing through the steps shown in FIG. 4, utilizing the above relationships.

More specifically, in Step S211, the decoder 203 computes the log likelihoods $I\alpha_t(m)$ and $I\gamma_t(m', m)$, using the formulas (15) and (17) above, each time it receives $y_t$.

Then, in Step S212, after receiving all the system $Y_1^T$, the decoder 203 computes the log likelihood $I\beta_t(m)$ of state m for all values of time t, using the formula (16) above.

Thereafter, in Step S213, the decoder 203 computes the log soft-output $I\lambda_t$ at each time t by substituting the values obtained in Steps S211 and S212 for the log likelihoods $I\alpha_t$, $I\beta_t$ and $I\gamma_t$ in the formula (18) above.

With the above described processing steps, the decoder 203 can carry out the soft-output decoding, applying the Max-Log-BCJR algorithm.

As pointed out above, since the Max-Log-BCJR algorithm does not involve any multiplications, it can greatly reduce the volume of computational operations if compared with the BCJR algorithm.

Now, the Log-BCJR algorithm will be discussed below. The Log-BCJR algorithm is devised to improve the accuracy of approximation of the Max-Log-BCJR algorithm. More specifically, in the Log-BCJR algorithm, a correction term is added to the addition of probabilities of the formula (13) to obtain formula (19) below so that the sum of the addition of the formula (19) may represent a more accurate logarithmic value. The correction is referred to as log-sum correction hereinafter.

$$\log(e^x+e^y)=\max(x,y)+\log(1+e^{-|x-y|}) \quad (19)$$

The logarithmic operation of the left side of the equation (19) is referred to as log-sum operation and, for the purpose of convenience, the operator of a log-sum operation is expressed by means of "#" as shown in formula (20) below to follow the numeration system described in S. S. Pietrobon, "Implementation and performance of a turbo/MAP decoder, Int. J. Satellite Commun., vol. 16, pp. 23–46, January–February 1998". Then, the operator of a cumulative addition is expressed by means of "#Σ" as shown in formula (21) below (although it is expressed by means of "E" in the above paper).

$$x \# y = \log(e^x + e^y) \quad (20)$$

$$\#\sum_{i=0}^{M-1} x_i = ((\ldots((x_0 \# x_1)\# x_2)\ldots)\# x_{M-1}) \quad (21)$$

By using the operator, the log likelihoods $I\alpha_t$ and $I\beta_t$ and the log soft-output $I\lambda_t$ can be expressed respectively in a manner as shown in formulas (22) through (24) below. Since the log likelihood $I\gamma_t$ is expressed by the formula (17) above, it will not be described here any further.

$$I\alpha_t(m) = \#\sum_{m'=0}^{M-1} (I\alpha_{t-1}(m') + I\gamma_t(m',m)) \quad (22)$$

$$I\beta_t(m) = \#\sum_{m'=0}^{M-1} (I\beta_{t+1}(m') + I\gamma_{t+1}(m,m')) \quad (23)$$

$$I\lambda_{ij}(m) = \#\sum_{\substack{m',m \\ i_j(m',m)=1}} (I\alpha_{t-1}(m') + I\gamma_t(m',m) + I\beta_t(m)) - \quad (24)$$

$$\#\sum_{\substack{m',m \\ i_j(m',m)=1}} (I\alpha_{t-1}(m') + I\gamma_t(m',m) + I\beta_t(m))$$

Note that the cumulative addition of the log-sum operations in state m' at the right side of the equation of (22) is determined in state m' showing a transition to state m. Similarly, the cumulative addition of the log-sum operations in state m' at the right side of the equation of (23) is determined in state m' showing a transition to state m. In the equation of (24), the cumulative addition of the log-sum operations at the first term of the right side is determined in state m' showing a transition to state m when the input is "1" and the cumulative addition of the log-sum operations at the second term of the right side is determined in state m' showing a transition to state m when the input is "0".

Thus, for soft-output decoding, applying the Log-BCJR algorithm, the decoder 203 determines soft-output $\lambda_t$ by passing through the steps shown in FIG. 4, utilizing the above relationships.

More specifically, in Step S211, the decoder 203 computes the log likelihoods $I\alpha_t(m)$ and $I\gamma_t(m', m)$, using the formulas (22) and (17) above, each time it receives $y_t$.

Then, in Step S212, after receiving all the system $Y_1^T$, the decoder 203 computes the log likelihood $I\beta_t(m)$ of state m for all values of time t, using the formula (23) above.

Thereafter, in Step S213, the decoder 203 computes the log soft-output $I\lambda_t$ at each time t by substituting the values obtained in Steps S211 and S212 for the log likelihoods $I\alpha_t$, $I\beta_t$ and $I\gamma_t$ in the formula (24) above.

With the above described processing steps, the decoder 203 can carry out the soft-output decoding, applying the Log-BCJR algorithm. Since the correction term that is the second term at the right side of the above equation of (19) is expressed in a one-dimensional function relative to variable |x−y|, the decoder 203 can accurately calculate probabilities when the values of the second term are stored in advance in the form of a table in a ROM (Read-Only Memory).

By comparing the Log-BCJR algorithm with the Max-Log-BCJR algorithm, it will be seen that, while it entails an increased volume of arithmetic operations, it does not involve any multiplications and the output is simply the logarithmic value of the soft-output of the BCJR algorithm if the quantization error is disregarded.

Meanwhile, methods that can be used for correcting the above described log-sum includes the secondary approximation method of approximating the relationship with variable |x−y| by so-called secondary approximation and the interval division method of arbitrarily dividing variable |x−y| into intervals and assigning predetermined values to the respective intervals in addition to the above described method of preparing a table for the values of the correction term. These log-sum correction methods are developed by putting stress on the performance of the algorithm in terms of accurately determining the value of the correction term. However, they are accompanied by certain problems including a large circuit configuration and slow processing operations.

Therefore, studies are being made to develop high speed log-sum correction methods. Such methods include the linear approximation method of linearly approximating the relationship with variable |x−y| and/or the threshold value approximation method of determining values for predetermined intervals of variable |x−y| respectively by using predetermined threshold values.

The linear approximation method is designed to approximate function F=log {1+e^(−|x−y|)} as indicated by curve C in FIG. 5A by a linear function as indicated by straight line L. The straight line L in FIG. 5A is expressed by means of equation F=−0.3 (|x−y|)+log 2 and the correction term shows a degree of degradation of about 0.1 dB.

On the other hand, the threshold value approximation method is designed to approximate function F=log {1+e^(−|x−y|)} as indicated by curve C in FIG. 5B by a step function as indicated by curve T. The curve T in FIG. 5B is expressed in a function that gives log 2 for the interval of 0≤|x−y|<1 and 0 for the interval of |x−y|≥1. The correction term shows a degree of degradation of about 0.2 dB.

Thus, while various methods have been discussed for the purpose of log-sum correction, all of them still have something to be improved.

BRIEF SUMMARY OF THE INVENTION

In view of the above identified circumstances, it is therefore the object of the present invention to provide a decoder and a decoding method that can perform log-sum corrections by means of linear approximation, putting stress on speed, with a reduced circuit dimension without adversely affecting the decoding performance of the circuit.

In an aspect of the invention, the above object is achieved by providing a decoder for determining the log likelihood logarithmically expressing the probability of passing a given state on the basis of the received value regarded as soft-input and decoding the input by using the log likelihood, said decoder comprising a linear approximation means for calculating a correction term to be added to the log likelihood, the correction term being expressed in a one-dimensional function relative to a variable said linear approximation means being adapted to compute said correction term using a coefficient representing the gradient of said function for multiplying said variable, the coefficient being expressed as a power exponent of 2.

Thus, a decoder according to the invention computes the correction term expressed in a one-dimensional function by means of a power exponent of 2.

In another aspect of the invention, there is provided a decoding method for determining the log likelihood logarithmically expressing the probability of passing a given state on the basis of the received value regarded as soft-input and decoding the input by using the log likelihood, said decoding method comprising a linear approximation step for calculating a correction term to be added to the log likelihood, the correction term being expressed in a one-dimensional function relative to a variable, said linear approximation step being adapted to compute said correction term using a coefficient representing the gradient of said function for multiplying said variable, the coefficient being expressed as a power exponent of 2.

Thus, a decoding method according to the invention is used to compute the correction term expressed in a one-dimensional function by means of a power exponent of 2.

As described above, a decoder for determining the log likelihood logarithmically expressing the probability of passing a given state on the basis of the received value regarded as soft-input and decoding the input by using the log likelihood according to the invention comprises a linear approximation means for a calculating a correction term to be added to the log likelihood, the correction term being expressed in a one-dimensional function relative to a variable, said linear approximation means being adapted to compute said correction term using a coefficient representing the gradient of said function for multiplying said variable, the coefficient being expressed as a power exponent of 2.

Therefore, a decoder according to the invention computes the correction term expressed in a one-dimensional function by means of a power exponent of 2. Thus, it can realize a high speed operation without adversely affecting the decoding performance of the circuit.

A decoding method for determining the log likelihood logarithmically expressing the probability of passing a given state on the basis of the received value regarded as soft-input and decoding the input by using the log likelihood according to the invention comprises a linear approximation step for a calculating a correction term to be added to the log likelihood, the correction term being expressed in a one-dimensional function relative to a variable, said linear approximation step being adapted to compute said correction term using a coefficient representing the gradient of said function for multiplying said variable, the coefficient being expressed as a power exponent of 2.

Therefore, a decoding method according to the invention is used to compute the correction term being expressed in a one-dimensional function by means of a power exponent of 2. Thus, it can realize a high speed operation without adversely affecting the decoding performance of the circuit.

DETAILED DESCRIPTION OF THE INVENTION

Now, the present invention will be described by referring to the views of the accompanying drawings that illustrate preferred embodiments of the invention.

Figure 1:
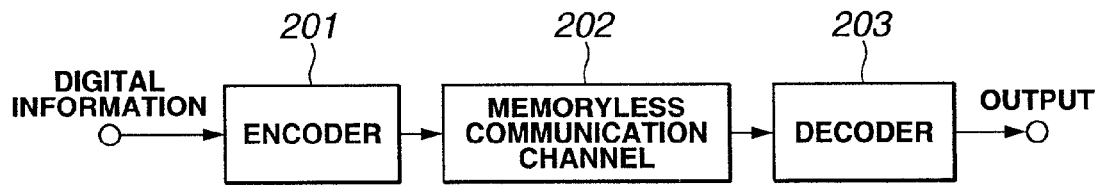
FIG. 1 is a schematic block diagram of a communication model.
Figure 2:
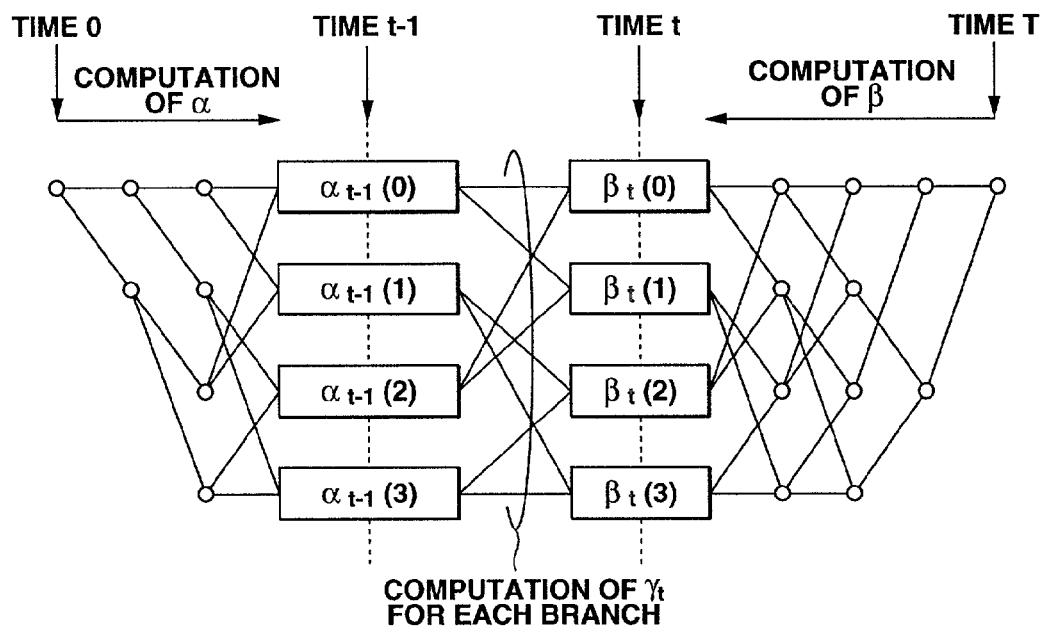
FIG. 2 is a schematic trellis diagram of a conventional encoder, illustrating the contents of probabilities $\alpha_t$, $\beta_t$ and $\gamma_t$.
Figure 3:
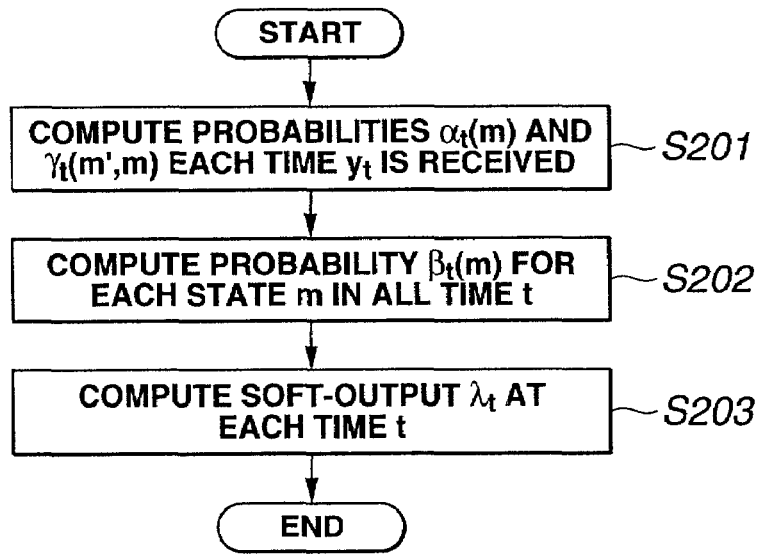
FIG. 3 is a flow chart illustrating the processing steps of a decoder for decoding a soft-output by applying the BCJR algorithm.
Figure 4:
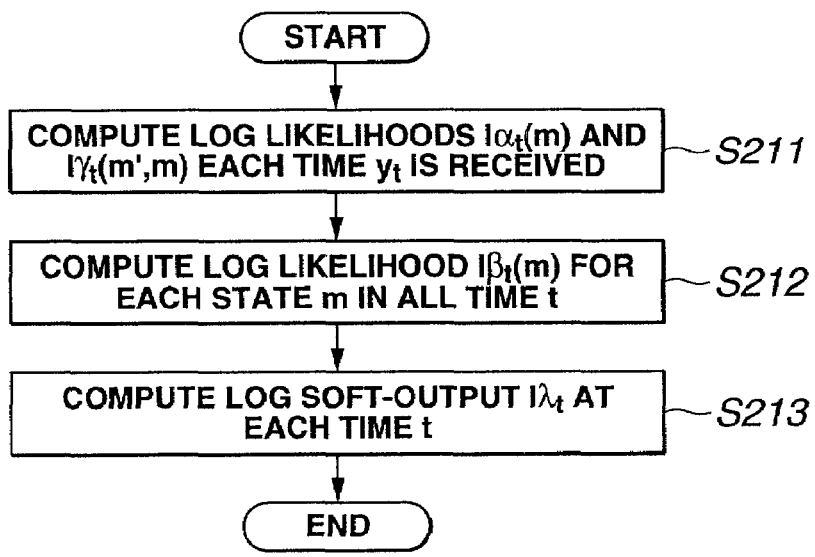
FIG. 4 is a flow chart illustrating the processing steps of a conventional decoder for decoding a soft-output by applying the Max-Log-BCJR algorithm.
Figure 5A:
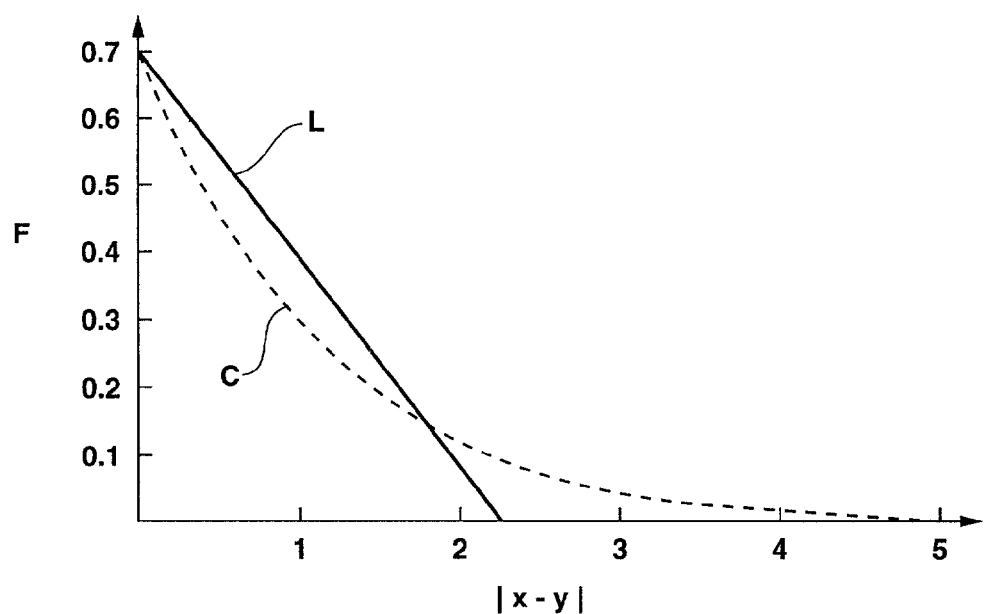
FIG. 5A is a graph illustrating a function having a correction term and an approximating function using a linear approximation technique.
Figure 5B:
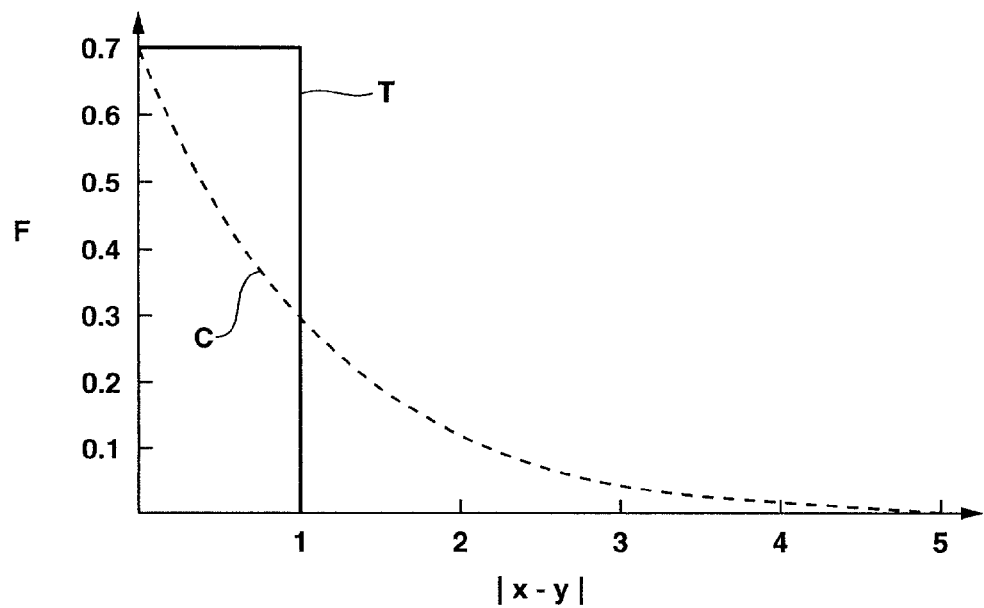
FIG. 5B is a graph illustrating a function having a correction term and an approximating function using a threshold value approximation technique.
Figure 6:
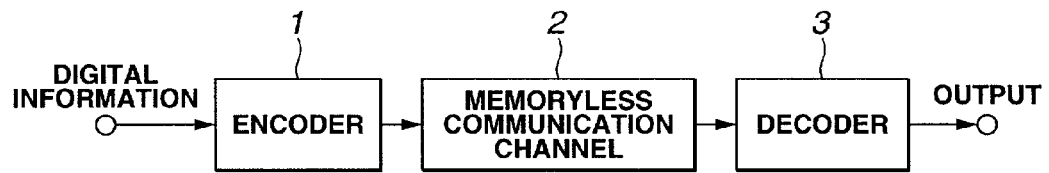
FIG. 6 is a schematic block diagram of a communication model to which a data transmission/reception system comprising an embodiment of the invention is applied.

FIG. 6 is a schematic block diagram of a communication model to which a data transmission/reception system comprising an embodiment of the invention is applied. More specifically, the data transmission/reception system includes a transmission unit (not shown) comprising an encoder 1 for putting digital information into convolutional codes, a memoryless communication channel 2 having noises and adapted to transmitting the output of the transmission unit and a reception unit (not shown) comprising a decoder 3 for decoding the convolutional codes from the encoder 1.

In the data transmission/reception system, the decoder 3 is adapted to decode the convolutional codes output from the encoder 1 on the basis of the maximum a posteriori probability (to be referred to as MAP hereinafter) obtained by using the Max-Log-MAP algorithm or the Log-MAP algorithm (to be respectively referred to as the Max-Log-BCJR algorithm or the Log-BCJR algorithm hereinafter) as described in Robertson, Villebrun and Hoeher, "A Comparison of Optimal and Sub-Optimal MAP Decoding Algorithms Operating in the Log Domain", IEEE Int. Conf. On Communications, pp. 1009–1013, June 1995. More specifically, it is adapted to determine the log likelihoods of $I\alpha_t$, $I\beta_t$ and $I\gamma_t$ and the log soft-output $I\lambda_t$ that are logarithmic expressions of probabilities $\alpha_t$, $\beta_t$ and $\gamma_t$ and soft output $\lambda_t$, using the natural logarithm.

In the following description, the M states (transitional states) representing the contents of the shift registers of the encoder 1 are denoted by integer m (m=0, 1, . . . , M−1) and the state at time t is denoted by $S_t$. If information of k bits is input in a time slot, the input at time t is expressed by means of $i_t=(i_{t1}, i_{t2}, \ldots, i_{tk})$ and the input system is expressed by means of $I_1^T=(i_1, i_2, \ldots, i_T)$. If there is a transition from state m' to state m, the information bits corresponding to the transition are expressed by means of i (m', m)=($i_1$(m', m), $i_2$(m', m), . . . , $i_k$(m', m)). Additionally, if a code of n bits is output in a time slot, the output at time t is expressed by means of $x_t=(x_{t1}, x_{t2}, \ldots, x_{tk})$ and the output system is expressed by means of $X_1^T=(x_1, x_2, \ldots, x_T)$. If there is a transition from state m' to state m, the information bits corresponding to the transition are expressed by means of x (m', m)=($x_1$(m', m), $x_2$(m', m), . . . , $x_n$(m', m)). The memoryless communication channel 2 receives $X_1^T$ as input and outputs $Y_1^T$. If a received value of n bits is output in a time slot, the output at time t is expressed by means of $y_t=(y_{t1}, y_{t2}, \ldots, y_{tn})$ and the output system is expressed by means of $Y_1^T=(y_1, y_2, \ldots, y_T)$.

Figure 7:
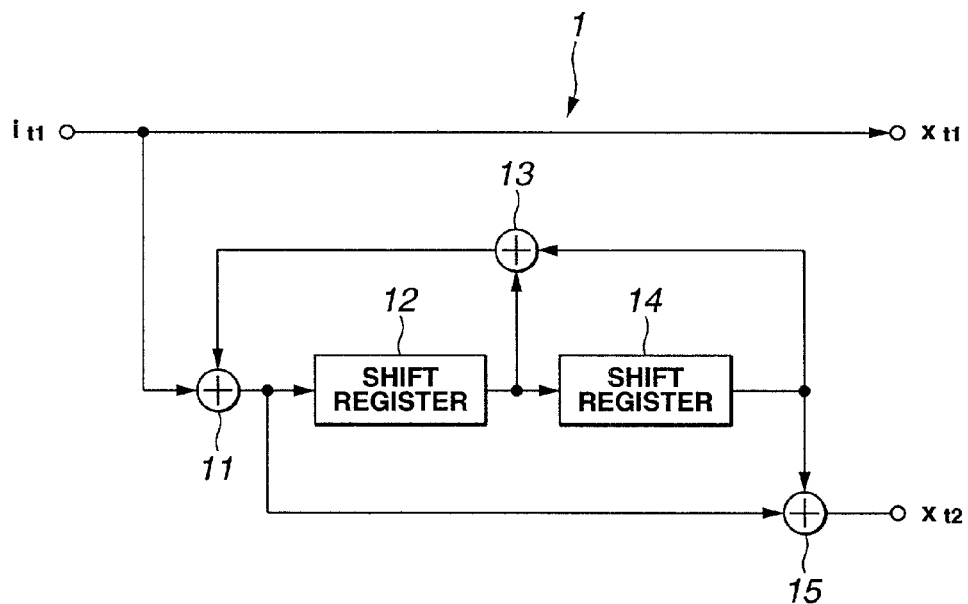
FIG. 7 is a schematic block diagram of the encoder of the data transmission/reception system of FIG. 6.

As shown in FIG. 7, the encoder 1 typically comprises three exclusive OR circuits 11, 13, 15 and a pair of shift registers 12, 14 and is adapted to carry out convolutional operations with a constraint length of "3".

The exclusive OR circuit 11 is adapted to carry out an exclusive OR operation, using 1-bit input data $i_{t1}$ and the data fed from the exclusive OR circuit 13 and supply the shift register 12 and the exclusive OR circuit 15 with the outcome of the operation.

The shift register 12 keeps on feeding the 1-bit data it holds to the a exclusive OR circuit 13 and the shift register 14. Then, the shift register 12 holds the 1-bit data fed from the exclusive OR circuit 11 in synchronism with a clock and additionally feeds the 1-bit data to the exclusive OR circuit 13 and the shift register 14.

The exclusive OR circuit 13 is adapted to carry out an exclusive OR operation, using the data fed from the shift registers 12, 14, and supply the exclusive OR circuit 11 with the outcome of the operation.

The shift register 14 keeps on feeding the 1-bit data it holds to the exclusive OR circuits 13, 15. Then, the shift register 14 holds the 1-bit data fed from the shift register 12 in synchronism with a clock and additionally feeds the 1-bit data to the exclusive OR circuits 13, 15.

The exclusive OR circuit 15 is adapted to carry out an exclusive OR operation, using the data fed from the exclusive OR circuit 11 and the data fed from the shift register 14, and then outputs the outcome of the operation as 1-bit output data $x_{t2}$ of 2-bit output data $x_t$ externally.

Thus, as the encoder 1 having the above described configuration receives 1-bit input data $i_{t1}$, it externally outputs the data as 1-bit input data $x_{t1}$ that is a systematic component of 2-bit output data $x_t$ without modifying it and carries out a recursive convolutional operation on the input data $i_{t1}$. Then, it outputs externally the outcome of the operation as the other 1-bit output data $x_{t2}$ of 2-bit output data $x_t$. In short, the encoder 1 performs a recursive systematic convolutional operation with a coding ratio of "½" and outputs externally output data $x_1$.

Figure 8:
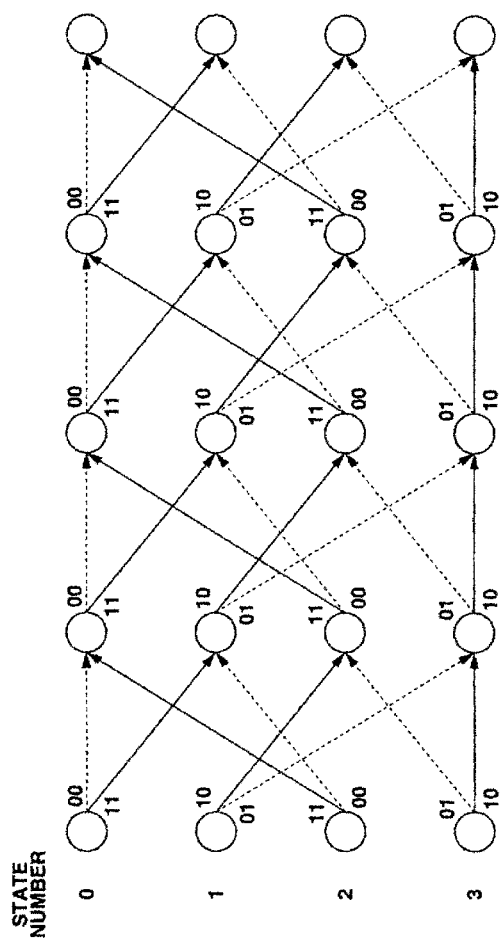
FIG. 8 is a schematic illustration of the trellis of the encoder of FIG. 6.

FIG. 8 illustrates the trellis of the encoder 1. Referring to FIG. 8, each path indicated by a broken line shows a case where input data $i_{t1}$ is "0" and each path indicated by a solid line shows a case where input data $i_{t1}$ is "1". The label applied to each path indicates 2-bit output data $x_t$. The states here are such that the contents of the shift register 12 and those of the shift register 14 are sequentially arranged and the states "00", "10", "01", "11" are denoted respectively by state numbers "0", "1", "2", "3". Thus, the number of states M of the encoder 1 is four and the trellis has such a structure that there are two paths getting to the states in the next time slot from the respective states. In the following description, the states corresponding to the above state numbers are denoted respectively by state 0, state 1, state 2, state 3.

The coded output data $x_t$ of the encoder 1 are then output to the receiver by way of the memoryless communication channel 2.

Figure 9:
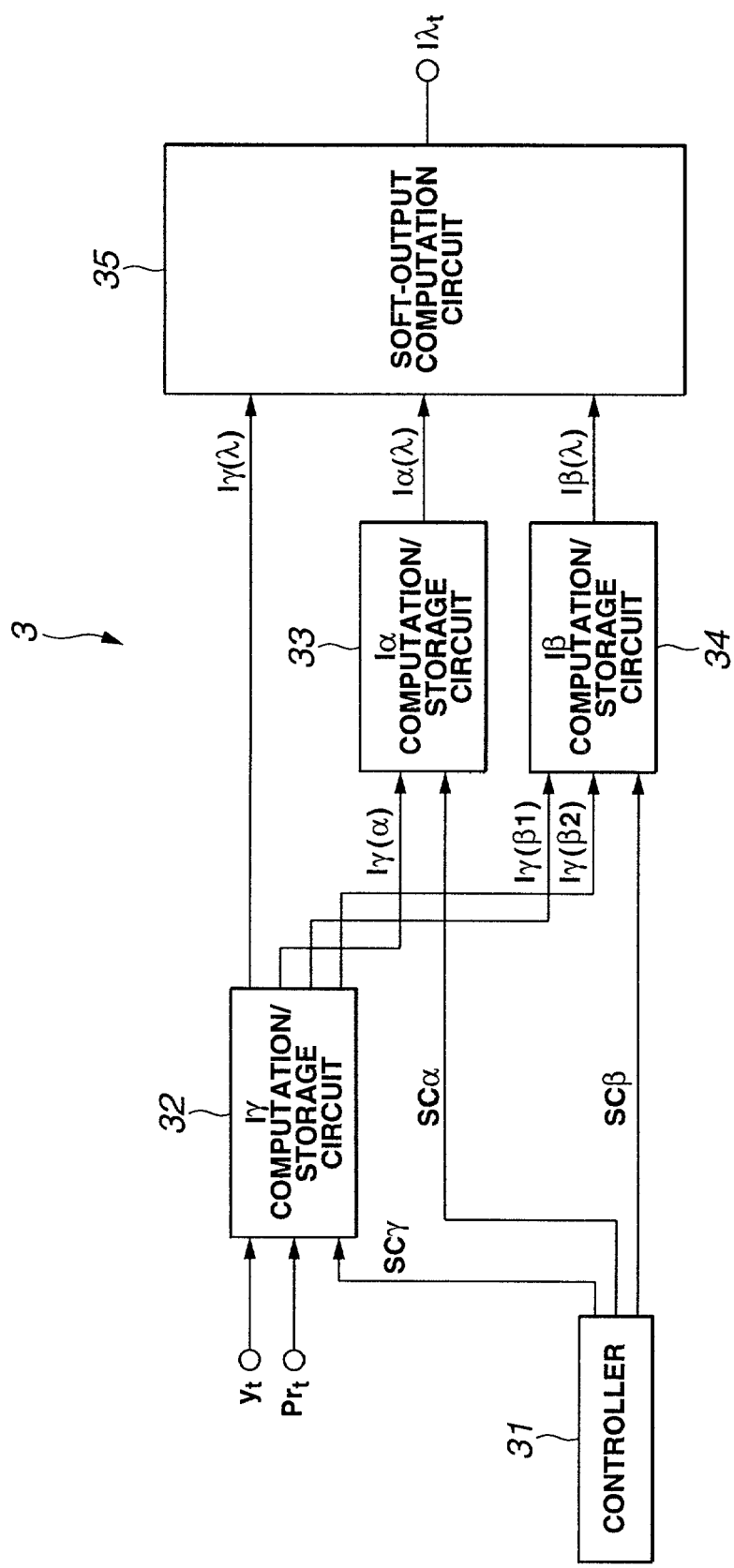
FIG. 9 is a schematic block diagram of the decoder of the data transmission/reception system of FIG. 6.

On the other hand, as shown in FIG. 9, the decoder 3 comprises a controller 31 for controlling the various components of the decoder 3, an Iγ computation/storage circuit 32 operating as the first probability computing means for computing and storing log likelihood Iγ as the first log likelihood, an Iα computation/storage circuit 33 operating as the second probability computing means for computing and storing log likelihood Iα as the second log likelihood, an Iβ computation/storage circuit 34 operating as the third probability computing means for computing and storing log likelihood Iβ as the third log likelihood and a soft-output computation circuit 35 operating as soft-output computing means for computing log soft-output $I\lambda_t$. The decoder 3 estimates the input data $i_{t1}$ of the encoder 1 by determining the log soft-output $I\lambda_t$ from the received value $y_t$ showing an analog value under the influence of the noises generated on the memoryless communication channel 2 and hence regarded as soft-output.

The controller 31 supplies control signals SCγ, SCα and SCβ respectively to the Iγ computation/storage circuit 32, the Iα computation/storage circuit 33 and the Iβ computation/storage circuit 34 to control these circuits.

The Iγ computation/storage circuit 32 carries out the operation of formula (25) below for each received value $y_t$ under the control of the control signal SCγ fed from the controller 31, using the received value $y_t$ and a priori probability information $Pr_t$, to compute the log likelihood $I\gamma_t$ at time t and stores the obtained log likelihood. In short, the Iγ computation/storage circuit 32 computes the log likelihood Iγ expressing the probability γ in the log domain as determined for each received value $y_t$ on the basis of the code output pattern and the received value.

$$I\gamma_t(m',m) = \log(Pr\{i_t = i(m',m)\}) + \log(Pr\{y_t|x(m',m)\}) \quad (25)$$

The a priori probability $Pr_t$ is obtained as probability $Pr\{i_{t1}=1\}$ that each of input data $i_{t1}$, $i_{t1}$ are equal to "1" or probability $Pr\{i_{t1}=0\}$ that each of input data $i_{t1}$, $i_{t1}$ are equal to "0" as indicated by formula (26) below. The a priori probability $Pr_t$ can alternatively be obtained as probability $Pr\{i_{t1}=1\}$ or probability $Pr\{i_{t1}=0\}$ by inputting the natural log value of the log likelihood ratio of probability $Pr\{i_{t1}=1\}$ to $Pr\{i_{t1}=0\}$, considering the fact that the sum of the probability $Pr\{i_{t1}=1\}$ and the probability $Pr\{i_{t1}=0\}$ is equal to "1".

$$Pr_t = \begin{cases} \log Pr\{i_{t_1} = 1\} \\ \log Pr\{i_{t_1} = 0\} \end{cases} \quad (26)$$

The Iγ computation/storage circuit 32 supplies the log likelihood $I\gamma_t$ it stores to the Iα computation/storage circuit 33, the Iβ computation/storage circuit 34 and the soft-output computation circuit 35. More specifically, the Iγ computation/storage circuit 32 supplies the log likelihood $I\gamma_t$ to the Iα computation/storage circuit 33, the Iβ computation/storage circuit 34 and the soft-output computation circuit 35 in a sequence good for the processing operations of these circuits. In the following description, the log likelihood $I\gamma_t$ supplied from the Iγ computation/storage circuit 32 to the Iα computation/storage circuit 33 is expressed by means of Iγ(α), the log likelihood $I\gamma_t$ supplied from the Iγ computation/storage circuit 32 to the Iβ computation/storage circuit 34 is expressed by means of Iγ(β1), Iγ(β2) and the log likelihood Iγ, supplied from the Iγ computation/storage circuit 32 to soft-output computation circuit 35 is expressed by means of Iγ(λ).

The Iα computation/storage circuit 33 carries out the operation of formula (27) below under the control of the control signal SCα fed from the controller 31, using the log likelihood Iγ(α) fed from the Iγ computation/storage circuit 32 to compute the log likelihood $I\alpha_t$ at time t and stores the obtained log likelihood. In the formula (27), operator "#" denotes the so-called log-sum operation for the log likelihood of transition from state m' to state m with input "0" and the log likelihood of transition from state m" to state m with input "1". More specifically, the Iα computation/storage circuit 33 computes the log likelihood $I\alpha_t$ at time t by carrying out the operation of formula (28). In other words, the Iα computation/storage circuit 33 computes the log likelihood Iα expressing in the log domain the probability α of transition from the coding starting state to each state as determined on a time series basis for each received value $y_t$. Then, the Iα computation/storage circuit 33 supplies the log likelihood $I\alpha_1$ it stores to the soft-output computation circuit 35. At this time the Iα computation/storage circuit 33 supplies the log likelihood $I\alpha_t$ to the soft-output computation circuit 35 in a sequence good for the processing operations of the circuit 35. In the following description, the log likelihood $I\alpha_t$ supplied from the Iα computation/storage circuit 33 to the soft-output computation circuit 35 is expressed by means of Iα(λ).

$$I\alpha_t(m) = (I\alpha_{t-1}(m') + I\gamma_t(m', m)) \quad (27)$$
$$\#(I\alpha_{t-1}(m'') + I\gamma_t(m'', m))$$

$$I\alpha_t(m) = \max(I\alpha_{t-1}(m') + I\gamma_t(m', m), I\alpha_{t-1}(m'') + \quad (28)$$
$$I\gamma_t(m'', m)) + \log(1 +$$
$$e^{-|(I\alpha_{t-1}(m') + I\gamma_t(m',m)) \ldots (I\alpha_{t-1}(m'') + I\gamma_t(m'',m))|})$$

The Iβ computation/storage circuit 34 carries out the operation of formula (29) below under the control of the control signal SCβ fed from the controller 31, using the log likelihoods Iγ(β1) and Iγ(β2) fed from the Iγ computation/storage circuit 32 to compute the log likelihoods $I\beta_t$ at time t of the two systems and stores the obtained log likelihoods. In the formula (29), operator "#" denotes the so-called log sum operation for the log likelihood of transition from state m' to state m with input "0" and the log likelihood of transition from state m" to state m with input "1". More specifically, the Iβ computation/storage circuit 34 computes the log likelihood $I\beta_t$ at time t by carrying out the operation of formula (30). In other words, the Iβ computation/storage circuit 34 computes the log likelihood Iβ expressing in the log domain the probability β of inverse transition from the coding terminating state to each state as determined on a time series basis for each received value $y_t$. Then, the Iβ computation/storage circuit 34 supplies the log likelihood $I\beta_t$ of one of the systems out of the log likelihoods $I\beta_t$ it stores to the soft-output computation circuit 35. At this time the Iβ computation/storage circuit 34 supplies the log likelihood $I\beta_t$ to the soft-output computation circuit 35 in a sequence good for the processing operations of the circuit 35. In the following description, the log likelihood $I\beta_t$ supplied from the Iβ computation/storage circuit 34 to the soft-output computation circuit 35 is expressed by means of Iβ(λ).

$$I\beta_t(m) = (I\beta_{t+1}(m') + I\gamma_{t+1}(m, m')) \quad (29)$$
$$\#(I\beta_{t+1}(m'') + I\gamma_{t+1}(m, m''))$$

$$I\beta_t(m) = \max(I\beta_{t+1}(m') + I\gamma_{t+1}(m, m'), I\beta_{t+1}(m'') + \quad (30)$$
$$I\gamma_{t+1}(m, m'')) +$$
$$\log(1 + e^{-|(I\beta_{t+1}(m') + I\gamma_{t+1}(m,m')) - (I\beta_{t+1}(m'') + I\gamma_{t+1}(m,m''))|})$$

The soft-output computation circuit 35 carries out the operation of formula (31) below, using the log likelihood Iγ(λ) fed from the Iγ computation/storage circuit 32 and the log likelihood Iα(λ) fed from the Iα computation/storage circuit 33, to compute the log soft-output $I\lambda_t$ at time t and stores the obtained log soft-outputs. After rearranging the log soft-outputs $I\lambda_t$ it sores, the soft-output computation circuit 35 outputs them externally. In the formula (31), operator "#Σ" denotes the cumulative addition of the so-called log sum operations using the above described operator "#".

$$I\lambda_t = \# \sum_{\substack{m',m \\ i(m',m)=1}} (I\alpha_{t-1}(m') + I\gamma_t(m',m) + I\beta_t(m)) - \quad (31)$$

$$\# \sum_{\substack{m',m \\ i(m',m)=1}} (I\alpha_{t-1}(m') + I\gamma_t(m',m) + I\beta_t(m))$$

The decoder 3 having the above described configuration computes the log likelihood $I\gamma_t(m', m)$ by means of the $I\gamma$ computation/storage circuit 32 and also the log likelihood $I\alpha_t(m)$ by means of the $I\alpha$ computation/storage circuit 33 each time it receives as input the soft-input value $y_t$ received by the receiving unit. Upon receiving all the received values $y_t$, the decoder 3 computes the log likelihood $I\beta_t$ for each state m for all the values of time t by means of the $I\beta$ computation/storage circuit 34. Then, the decoder 3 computes the log soft-output $I\lambda_1$ for each time t by means of the soft-output computation circuit 35, using the obtained log likelihoods $I\alpha_t$, $I\beta_t$ and $I\gamma_t$. In this way, the decoder 3 can operate for soft-output decoding by applying the Log-BCJR algorithm.

Now, the decoder 3 operates with a reduced circuit size when computing the log likelihoods $I\alpha_t$ and $I\beta_t$ by means of the $I\alpha$ computation/storage circuit 33 and the $I\beta$ computation/storage circuit 34. The $I\alpha$ computation/storage circuit 33 and the $I\beta$ computation/storage circuit 34 will be described in greater detail hereinafter.

Figure 10:
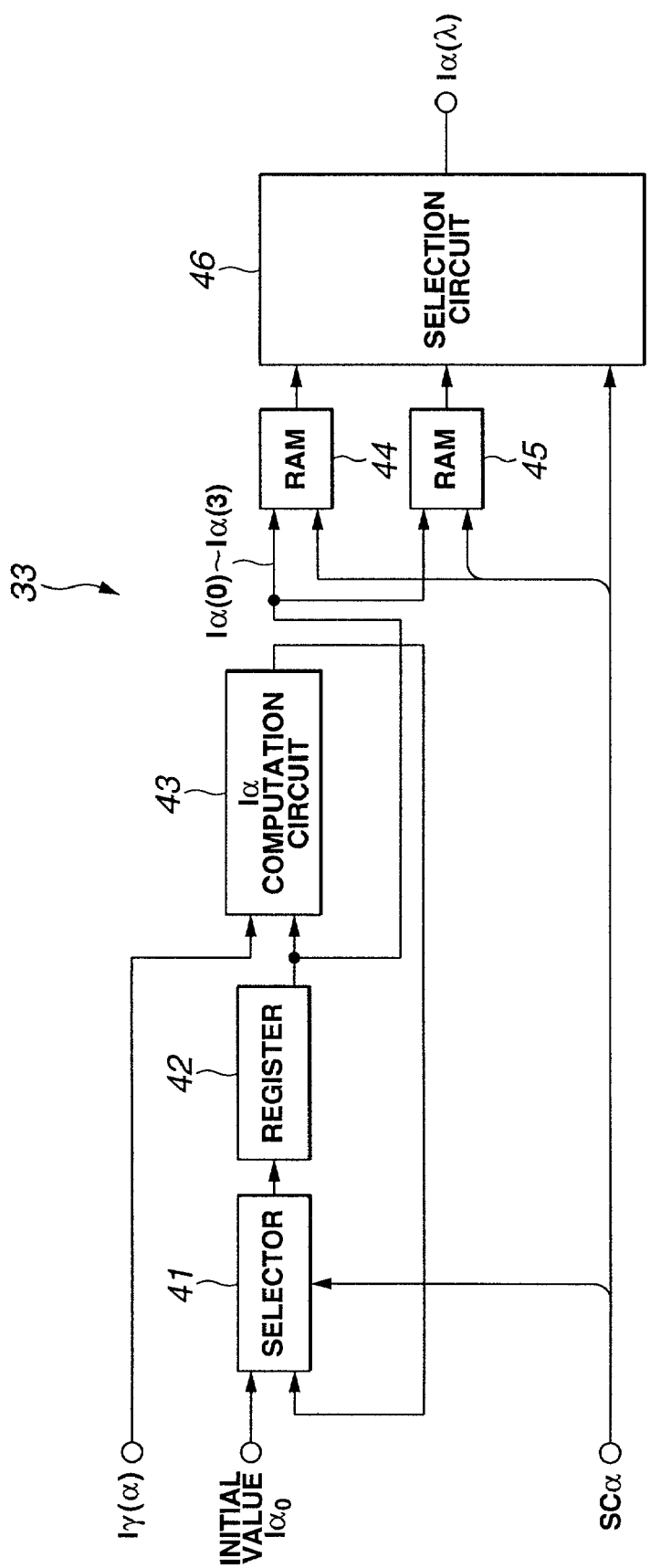
FIG. 10 is a schematic block diagram of the $I\alpha$ computation/storage circuit of the decoder of FIG. 9, illustrating the circuit configuration.

Firstly, the $I\alpha$ computation/storage circuit 33 will be described. As shown in FIG. 10, the $I\alpha$ computation/storage circuit 33 comprises a selector 41 for selecting either the computed log likelihoods $I\alpha$ or the initial value of the log likelihood $I\alpha_0$, a register 42 for holding either the computed log likelihoods $I\alpha$ or the initial value of the log likelihood $I\alpha$, an $I\alpha$ computation circuit 43 for computing the log likelihood $I\alpha$ in each state, RAMs (random access memories) 44, 45 for sequentially holding the log likelihoods $I\alpha$ of different states and a selection circuit 46 for selectively taking out the log likelihood $I\alpha$ read out from the RAMs 44, 45.

The selector 41 selects the initial value of the log likelihood $I\alpha_0$ at the time of initialization or the log likelihoods $I\alpha$ fed from the $I\alpha$ computation circuit 43 at any time except the time of initialization under the control of control signal SC$\alpha$ fed from the controller 31. The initialization occurs in the time slot immediately before the $I\gamma$ computation/storage circuit 32 starts outputting log likelihoods $I\gamma(\alpha)$. If the decoder 3 realizes the time when the encoder 1 starts a coding operation, log 1=0 is given as initial value $I\alpha_0$ in state 0 whereas log 0=$-\infty$ is given as initial value in any other state. If, on the other hand, the decoder 3 does not realize the time when the encoder 1 starts a coding operation, log (1/M), or log (¼) in the above instance, is given in all states. However, what is essential here is that a same value is given in all states so that 0 may alternatively be given in all states. The selector 41 supplies the initial value $I\alpha_0$ or the log likelihoods $I\alpha$, whichever it selects, to the register 42.

The register 42 holds the initial value $I\alpha_0$ or the log likelihoods $I\alpha$ supplied from the selector 41. Then, in the next time slot, the register 42 supplies the initial value $I\alpha_0$ or the log likelihoods $I\alpha$ it holds to the $I\alpha$ computation circuit 43 and the RAMs 44, 45.

Figure 11:
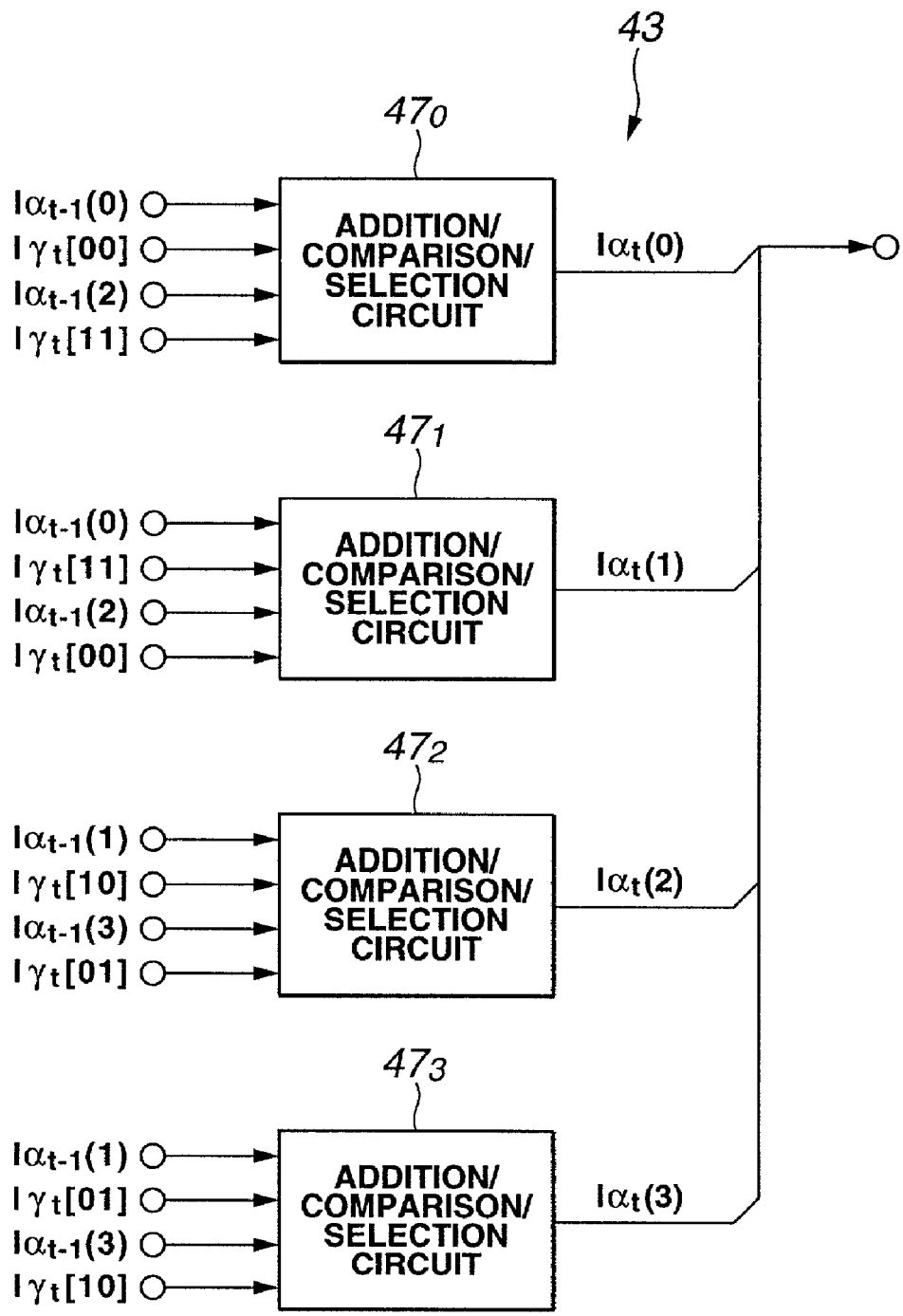
FIG. 11 is a schematic block diagram of the $I\alpha$ computation circuit of the $I\alpha$ computation/storage circuit of FIG. 10, illustrating the circuit configuration.

Referring now to FIG. 11, the $I\alpha$ computation circuit 43 comprises addition/comparison/selection circuits, the number of which corresponds to the number of states. In the above instance, the $I\alpha$ computation circuit 43 comprises four addition/comparison/selection circuits $47_0$, $47_1$, $47_2$ and $47_3$.

Each of the addition/comparison/selection circuits $47_0$, $47_1$, $47_2$ and $47_3$ are fed with the log likelihoods $I\gamma_t[00]$, $I\gamma_t[10]$, $I\gamma_t[01]$ and $I\gamma_t[11]$ of the branches corresponding to the respective outputs "00", "10", "01" and "11" on the trellis as computed by the $I\gamma$ computation/storage circuit 32 on the basis of the transitions on the trellis and the log likelihoods slot $I\alpha_{t-1}(0)$, $I\alpha_{t-1}(1)$, $I\alpha_{t-1}(2)$, $I\alpha_{t-1}(3)$ in all the sates in the immediately preceding time. Then, each of the addition/comparison/selection circuits $47_0$, $47_1$, $47_2$ and $47_3$ determines the log likelihoods $I\alpha$ in the next time slot in state 0, state 1, state 2 and state 3.

More specifically, the addition/comparison/selection circuits $47_0$ receives the log likelihoods $I\gamma_t[00]$, $I\gamma_t[11]$ and the log likelihoods $I\alpha_{t-1}(0)$, $I\alpha_{t-1}$ inputs and determines the log likelihood $I\alpha_t(0)$ in state 0.

Similarly, the addition/comparison/selection circuits $47_1$ receives the log likelihoods $I\gamma_t[11]$, $I\gamma_t[00]$ and the log likelihoods $I\alpha_{t-1}(0)$, $I\alpha_{t-1}(2$ and determines the log likelihood $I\alpha_t(1)$ in state 1.

Then, the addition/comparison/selection circuits $47_2$ receives the log likelihoods $I\gamma_t[10]$, $I\gamma_t[01]$ and the log likelihoods $I\alpha_{t-1}(1)$, $I\alpha_{t-1}(3$ and determines the log likelihood $I\alpha_t(2)$ in state 2.

Furthermore, the addition/comparison/selection circuits $47_3$ receives the log likelihoods $I\gamma_t[01]$, $I\gamma_t[10]$ and the log likelihoods $I\alpha_{t-1}(1)$, $I\alpha_{t-1}(3)$ as inputs and determines the log likelihood $I\alpha_t(3)$ in state 3.

In this way, the $I\alpha$ computation circuit 43 performs the computation of the formula (27) and hence that of the formula (28) above, using the log likelihoods $I\gamma(\alpha)$ fed from the $I\gamma$ computation/storage circuit 32 and the initial value $I\alpha_0$ or the log likelihoods $I\alpha$ in the immediately preceding time slot held by the register 42, to determine the log likelihoods $I\alpha$ in all states in the next time slot. Then, the $I\alpha$ computation circuit 43 supplies the computed log likelihoods $I\alpha$ to the selector 41. The addition/comparison/selection circuits $47_0$, $47_1$, $47_2$ and $47_3$ will be described in greater detail hereinafter.

The RAMs 44, 45 sequentially stores the log likelihoods $I\alpha(0)$, $I\alpha(1)$, $I\alpha(2)$ and $I\alpha(3)$ fed from the register 42 under the control of the control signal SC$\alpha$ from the controller 31. If each of the log likelihoods $I\alpha(0)$, $I\alpha(1)$, $I\alpha(2)$ and $I\alpha(3)$ is expressed in 8 bits, the RAMs 44, 45 stores the log likelihoods $I\alpha(0)$, $I\alpha(1)$, $I\alpha(2)$ and $I\alpha(3)$ as a word of 32 bits. The log likelihoods $I\alpha(0)$, $I\alpha(1)$, $I\alpha(2)$ and $I\alpha(3)$ stored in the RAMs 44, 45 are then read out therefrom by selection circuit 46 in a predetermined sequence.

The selection circuit 46 selectively takes out the log likelihoods $I\alpha(0)$, $I\alpha(1)$, $I\alpha(2)$ or $I\alpha(3)$ that are read from the RAMs 44, 45 and supplies it to the soft-output computation circuit 35 as log likelihood $I\alpha(\lambda)$ under the control of the control signal SC$\alpha$ from the controller 31.

Thus, the $I\alpha$ computation/storage circuit 33 initializes in a time slot immediately before the $I\gamma$ computation/storage circuit 32 starts outputting log likelihoods $I\gamma(\alpha)$ and causes the register 42 to hold the initial value $I\alpha_0$ selected by the selector 41. Then, in the subsequent clock cycles, the $I\alpha$ computation/storage circuit 33 causes the $I\alpha$ computation circuit 43 to sequentially compute the log likelihoods $I\alpha$ in the next time slot, using the log likelihoods $I\gamma(\alpha)$ fed from the $I\gamma$ computation/storage circuit 32 and the log likelihoods $I\alpha$ in the immediately preceding time slot fed from the register 42, and makes the register 42 store the log likelihoods $I\alpha$. Furthermore, the $I\alpha$ computation/storage 33 causes the RAMs 44, 45 to sequentially store the log likelihoods $I\alpha(0)$, $I\alpha(1)$, $I\alpha(2)$ and $I\alpha(3)$ in the respective states held in the register 42 and makes the selection circuit 46 to read them out in a predetermined sequence and supply them to the soft-output computation circuit 35 as log likelihoods $I\alpha(\lambda)$.

Figure 12:
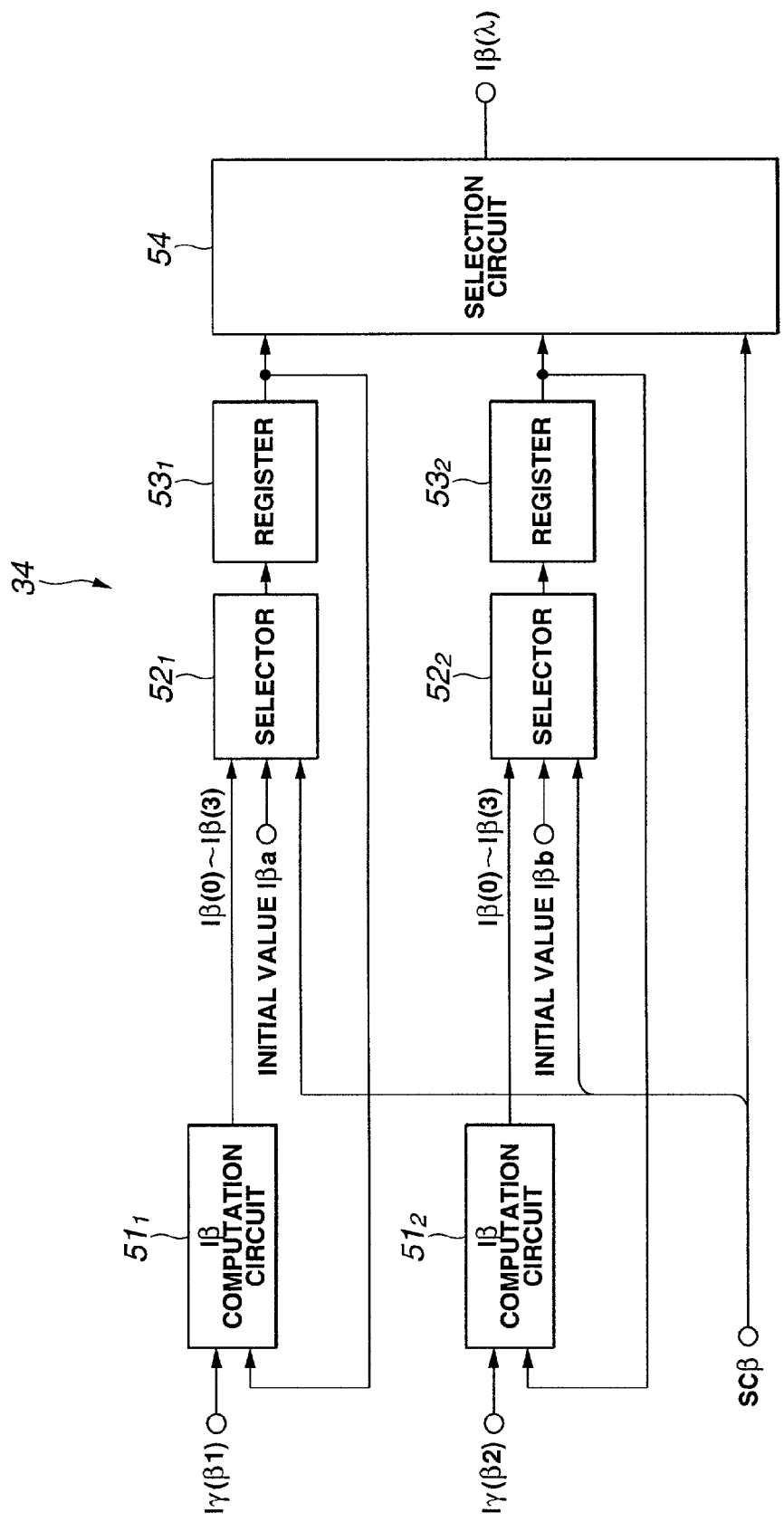
FIG. 12 is a schematic block diagram of the $I\beta$ computation/storage circuit of the decoder of FIG. 9, illustrating the circuit configuration.

Now, the $I\beta$ computation/storage circuit 34 will be described. As shown in FIG. 12, the $I\beta$ computation/storage circuit 34 comprises $I\beta$ computation circuits $51_1$, $51_2$ for computing the log likelihoods $I\beta$ in the states, selectors $52_1$, $52_2$ for selecting either the computed log likelihoods $I\beta$ or the initial values of the log likelihoods $I\beta a$, $I\beta b$, registers $53_1$, $53_2$ for holding the initial values $I\beta a$, $I\beta b$ or the log likelihoods $I\beta$ and a selection circuit 54 for selectively taking out one of the log likelihoods fed from the registers $53_1$, $53_2$.

Figure 13:
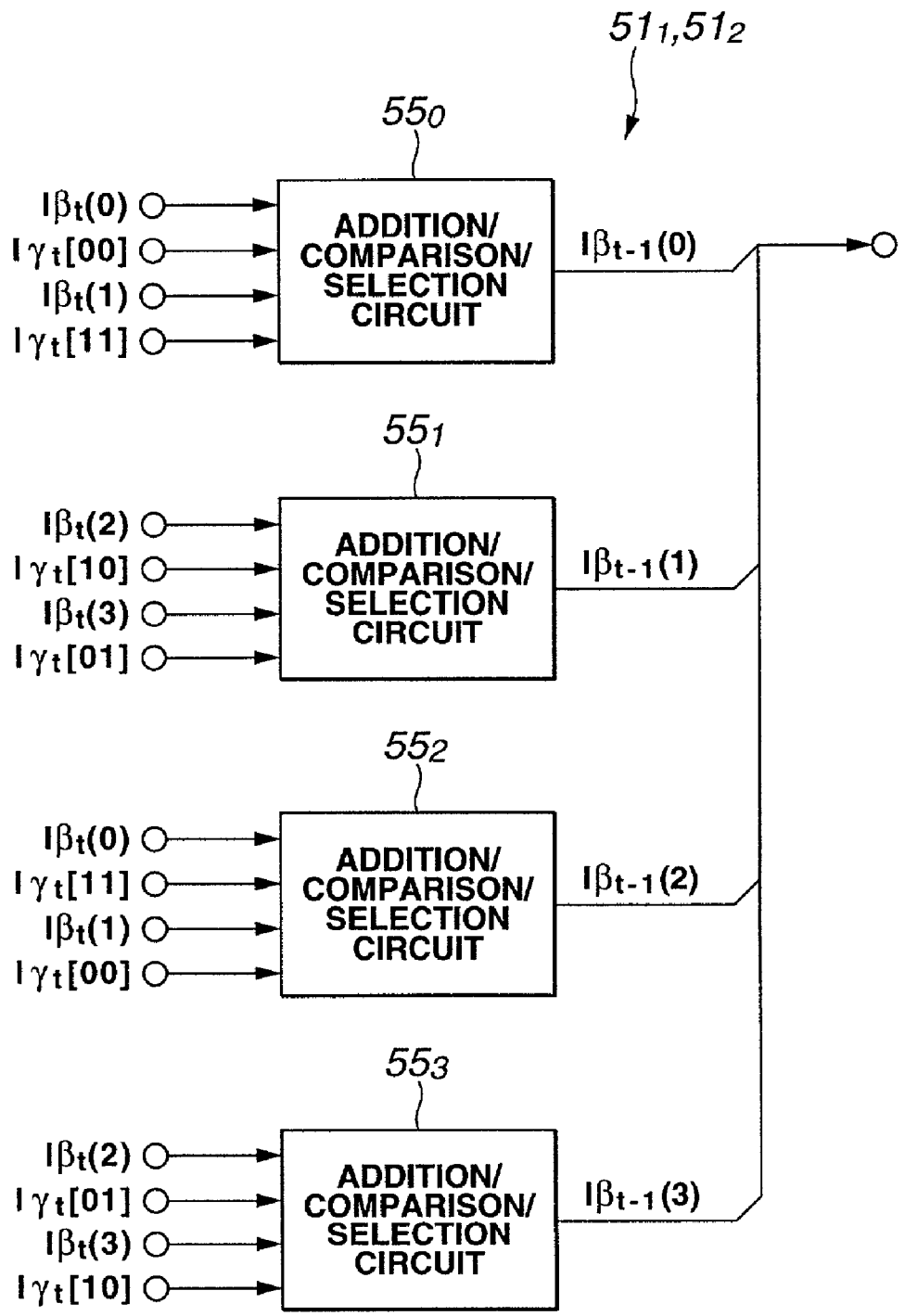
FIG. 13 is a schematic block diagram of the $I\beta$ computation circuit of the $I\beta$ computation/storage circuit of FIG. 12, illustrating the circuit configuration.

Referring now to FIG. 13, each of the $I\beta$ computation circuits $51_1$, $51_2$ comprises addition/comparison/selection circuits, the number of which corresponds to the number of states. In the above instance, each of the $I\beta$ computation circuits $51_1$, $51_2$ comprises four addition/comparison/selection circuits $55_0$, $55_1$, $55_2$ and $55_3$.

Each of the addition/comparison/selection circuits $55_0$, $55_1$, $55_2$ and $55_3$ are fed with the log likelihoods $I\gamma_t[00]$, $I\gamma_t[10]$, $I\gamma_t[01]$, $I\gamma_t[11]$ of the branches corresponding to the respective outputs "00", "10", "01", "11" on the trellis as computed on the basis of the transitions on the trellis by the $I\gamma$ computation/storage circuit 32 and the log likelihoods $I\beta_t(0)$, $I\beta_t(1)$, $I\beta_t(2)$, and $I\beta_t(3)$ in all the sates in the immediately preceding time slot. Then, each of the addition/comparison/selection circuits $55_0$, $55_1$, $55_2$ and $55_3$ determines the log likelihoods $I\beta$ in the immediately preceding time slot in state 0, state 1, state 2 and state 3.

More specifically, the addition/comparison/selection circuits $55_0$ receives the log likelihoods $I\gamma_t[00]$, $I\gamma_t[11]$ and the log likelihoods $I\beta_t(0)$, $I\beta_t(1)$ as inputs and determines the log likelihood $I\beta_{t-1}(0)$ in state 0.

Similarly, the addition/comparison/selection circuits $55_1$ receives the log likelihoods $I\gamma_t[10]$, $I\gamma_t[01]$ and the log likelihoods $I\beta_t(2)$, $I\beta_t(3)$ as inputs and determines the log likelihood $I\beta_{t-1}(1)$ in state 1.

Then, the addition/comparison/selection circuits $55_2$ receives the log likelihoods $I\gamma_t[11]$, $I\gamma_t[00]$ and the log likelihoods $I\beta_t(0)$, $I\beta_t(1)$ as inputs and determines the log likelihood $I\beta_{t-1}(2)$ in state 2.

Furthermore, the addition/comparison/selection circuits $55_3$ receives the log likelihoods $I\gamma_t[01]$, $I\gamma_t[10]$ and the log likelihoods $I\beta_t(2)$, $I\beta_t(3)$ as inputs and determines the log likelihood $I\beta_{t-1}(3)$ in state 3.

In this way, each of the $I\beta$ computation circuits $51_1$, $51_2$ performs the computation of the formula (29) and hence that of the formula (30) above, using the log likelihoods $I\gamma(\beta 1)$, $I\gamma(\beta 2)$ fed from the $I\gamma$ computation/storage circuit 32 and the initial values $I\beta a$, $I\beta b$ or the log likelihoods $I\beta$ held by the registers $53_1$, $53_2$, to determine the log likelihoods $I\beta$ in all states in the immediately preceding time slot. Each of the log likelihoods $I\beta(0)$, $I\beta(1)$, $I\beta(2)$, $I\beta(3)$ is expressed typically by 8 bits to make the total number of bits equal to 32. The $I\beta$ computation circuits $51_1$, $51_2$ respectively supply the computed log likelihoods $I\beta$ to the selectors $52_1$, $52_2$. The addition/comparison/selection circuits $55_0$, $55_1$, $55_2$ and $55_3$ will be described in greater detail hereinafter.

Each of the selectors $52_1$, $52_2$ selects the initial value of the log likelihood $I\beta a$ or $I\beta b$, whichever appropriate, at the time of initialization or the log likelihoods $I\beta$ fed from the $I\beta$ computation circuit $51_1$ or $51_2$, whichever appropriate, at any time except the time of initialization under the control of control signal $SC\beta$ fed from the controller 31. The initialization occurs in the time slot immediately before the $I\gamma$ computation/storage circuit 32 starts outputting log likelihoods $I\gamma(\beta 1)$, $I\gamma(\beta 2)$ and repeated in every cycle thereafter that is twice as long as the terminating length. While a same value such as 0 or log (1/M), or log (¼) in this instance, is normally given as initial values $I\beta a$, $I\beta b$ for all the states, log $1=0$ is given as the value in the concluding state whereas log $0=-\infty$ is given in any other state when a concluded code is decoded. The selectors $52_1$, $52_2$ supplies respectively either the initial values $I\beta a$, $I\beta b$ or the log likelihoods $I\beta$ they select to the respective registers $53_1$, $53_2$.

The registers $53_1$, $53_2$ hold the initial values $I\beta a$, $I\beta b$ or the log likelihoods $I\beta$ supplied from the selectors $52_1$, $52_2$. Then, in the next time slot, the registers $53_1$, $53_2$ supply the initial values $I\beta a$, $I\beta b$ or the log likelihoods $I\beta$ they hold to the $I\beta$ computation circuits $51_1$, $51_2$ and the selection circuit 54.

The selection circuit 54 selectively takes out the log likelihoods $I\beta(0)$, $I\beta(1)$, $I\beta(2)$ or $I\beta(3)$ that are supplied from the registers $53_1$, $53_2$ and supplies it to the soft-output computation circuit 35 as log likelihood $I\beta(\lambda)$ under the control of the control signal $SC\beta$ from the controller 31.

Thus, the $I\beta$ computation/storage circuit 34 initializes in a time slot immediately before the $I\gamma$ computation/storage circuit 32 starts outputting log likelihoods $I\gamma(\beta 1)$ and in the subsequently cycle periods having a length twice as long as the terminating length and causes the register $53_1$ to hold the initial value $I\beta a$ selected by the selector $52_1$. Then, in the subsequent clock cycles, the $I\beta$ computation/storage circuit 34 causes the $I\beta$ computation circuit $51_1$ to sequentially compute the log likelihoods $I\beta$ in the immediately preceding time slot, using the log likelihoods $I\gamma(\beta 1)$ fed from the $I\gamma$ computation/storage circuit 32 and the log likelihoods $I\beta$ fed from the register $52_1$, and makes the register $53_1$ store the log likelihoods $I\beta$.

Furthermore, the $I\beta$ computation/storage circuit 34 initializes in a time slot immediately before the $I\gamma$ computation/storage circuit 32 starts outputting log likelihoods $I\gamma(\beta 2)$ and in the subsequently cycle periods having a length twice as long as the terminating length and causes the register $53_2$ to hold the initial value $I\beta b$ selected by the selector $52_2$. Then, in the subsequent clock cycles, the $I\beta$ computation/storage circuit 34 causes the $I\beta$ computation circuit $51_2$ to sequentially compute the log likelihoods $I\beta$ in the immediately preceding time slot, using the log likelihoods $I\gamma(\beta 2)$ fed from the $I\gamma$ computation/storage circuit 32 and the log likelihoods $I\beta$ fed from the register $52_2$, and makes the register $53_2$ store the log likelihoods $I\beta$. Then, the $I\beta$ computation/storage circuit 34 causes the selection circuit 54 to read out the log likelihoods $I\beta(0)$, $I\beta(1)$, $I\beta(2)$ and $I\beta(3)$ in the respective states held in the registers $53_1$, $53_2$ in a predetermined sequence and supply them to the soft-output computation circuit 35 as log likelihoods $I\beta(\lambda)$.

Now, the addition/comparison/selection circuits $47_0$, $47_1$, $47_2$ and $47_3$ that the $I\alpha$ computation/storage circuit 33 comprises and the addition/comparison/selection circuits $55_0$, $55_1$, $55_2$ and $55_3$ that the $I\beta$ computation/storage circuit 34 comprises will be described below. However, since the addition/comparison/selection circuits $47_0$, $47_1$, $47_2$, $47_3$, $55_0$, $55_1$, $55_2$ and $55_3$ have a same and identical configuration and only differ from each other in term of inputs they receive and outputs they send out. Therefore, in the following description, they will be collectively referred to as addition/comparison/selection circuit 60. Furthermore, in the following description, the two log likelihoods $I\gamma$ input to each of the four addition/comparison/selection circuits $47_0$, $47_1$, $47_2$ and $47_3$ and the two log likelihoods Iγ input to each of the four addition/comparison/selection circuits $55_0$, $55_1$, $55_2$ and $55_3$ are denoted respectively and collectively by IA and IB, whereas the two log likelihoods Iα input to each of the four addition/comparison/selection circuits $47_0$, $47_1$, $47_2$ and $47_3$ and the two log likelihoods Iβ input to each of the four addition/comparison/selection circuits $55_0$, $55_1$, $55_2$ and $55_3$ are denoted respectively and collectively by IC and ID. Furthermore, the log likelihoods Iα output from each of the addition/comparison/selection circuits $47_0$, $47_1$, $47_2$ and $47_3$ and the log likelihoods Iβ output from each of the addition/comparison/selection circuits $55_0$, $55_1$, $55_2$ and $55_3$ are collectively denoted by IE. In the following description, any probability is expressed by means of a value not smaller than 0 and a lower probability is expressed by means of a larger value by taking situations where a decoder according to the invention is assembled as hardware.

Figure 14:
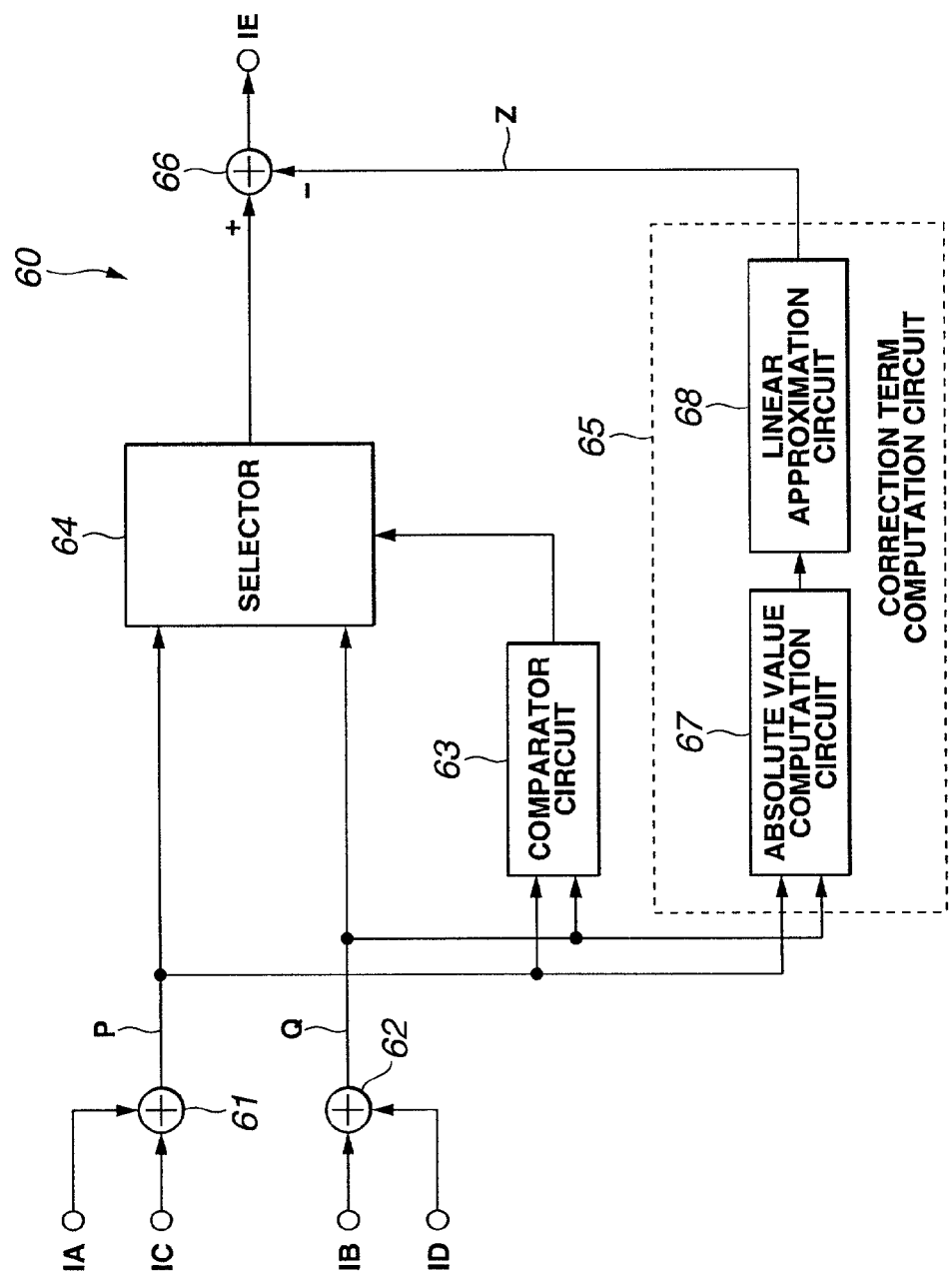
FIG. 14 is a schematic block diagram of the addition/comparison/selection circuit of the $I\alpha$ computation circuit or the $I\beta$ computation circuit, illustrating the circuit configuration.

As shown in FIG. 14, the addition/comparison/selection circuit 60 comprises adders 61, 62 for adding two data, comparator circuits 63 for comparing the outputs of the adders 61, 62 in terms of size, a selector 64 for selecting either one of the outputs of the adders 61, 62, a correction term computation circuit 65 for computing the value correction term of the Log-BCJR algorithm and a differentiators 66 for obtaining the difference of the two data.

The adder 61 is adapted to receive and add the log likelihoods IA, IC. If the addition/comparison/selection circuit 60 is the addition/comparison/selection circuit $47_0$, the adder 61 receives the log likelihood $I\gamma_t[00]$ and the log likelihood $I\alpha_{t-1}(0)$ as input and adds the log likelihood $I\gamma_t[00]$ and the log likelihood $I\alpha_{t-1}(0)$. The adder 61 then supplies the data obtained by the addition to the comparator circuit 63, the selector 64 and the correction term computation circuit 65. Note that, in the following description, the data output from the adder 61 is denoted by P.

The adder 62 is adapted to receive and add the log likelihoods IB, ID. If the addition/comparison/selection circuit 60 is the addition/comparison/selection circuit $47_0$, the adder 62 receives the log likelihood $I\gamma_t[11]$ and the log likelihood $I\alpha_{t-1}(2)$ as input and adds the log likelihood $I\gamma_t[11]$ and the log likelihood $I\alpha_{t-1}(2)$. The adder 62 then supplies the data obtained by the addition to the comparator circuit 63, the selector 64 and the correction term computation circuit 65. Note that, in the following description, the data output from the adder 62 is denoted by Q.

The comparator circuit 63 compares the value of the data P fed from the adder 61 and the value of the data Q fed from the adder 62 to see which is larger. Then, the comparator circuit 63 supplies the information on the comparison indicating the outcome of the comparison to the selector 64.

The selector 64 selects either the data P fed from the adder 61 or the data Q fed from the adder 62, whichever having a smaller value and hence showing a higher probability, on the basis of the information on the comparison supplied from the comparator circuit 63. Then, the selector 64 supplies the selected data to the differentiator 66. It will be appreciated that the data selected by the selector 64 is same and identical with the first term of the right side of the equation (28) and that of the equation (30) shown above.

The correction term computation circuit 65 comprises an absolute value computation circuit 67 for computing the absolute value of difference of the data P fed from the adder 61 and the data Q fed from the adder 62 and a linear approximation circuit 68 that operates as linear approximation means for computing the correction term by linear approximation, using the absolute value computed by the absolute value computation circuit 67. The correction term computation circuit 65 computes the value of the correction term of the Log-BCJR algorithm or the value of the second term of the right side of the equation (28) or the equation (30) shown above. More specifically, the correction term computation circuit 65 expresses the correction term as a one-dimensional function of variable |P−Q| and computes the linearly approximated value in the form of −a|P−Q|+b that uses coefficient −a (a>0) indicating the gradient of the function and coefficient b indicating the intercept of the function. Then, the correction term computation circuit 65 supplies the data Z obtained by the computation to the differentiator 66.

The differentiator 66 determines the difference of the data selected by the selector 64 and the data Z fed from the correction term computation circuit 65 and outputs the difference as log likelihood IE. For instance, if the addition/comparison/selection 60 is the addition/comparison/selection circuit $47_0$, the differentiator 66 outputs the log likelihood $I\alpha_t(0)$.

Now, the estimation of the delay at the addition/comparison/selection circuit 60 will be discussed below. It is assumed here that the delay of a comparator circuit and that of a differentiator are same as that of an ordinary adder such as the adder 61 or 62.

As clear from FIG. 14, the delay that is inevitable with the addition/comparison/selection 60 includes the delay due to the adders 61, 62 which can be regarded as a single adder, the delay due to the comparator circuit 63 and the delay due to the differentiator 66. In other words, the addition/comparison/selection 60 involves the delay of at least three adders.

Therefore, in order to minimize the delay of the addition/comparison/selection 60, it is necessary to minimize the delay due to the correction term computation circuit 65. Therefore, the delay due to the correction term computation circuit 65 will be estimated.

Figure 15:
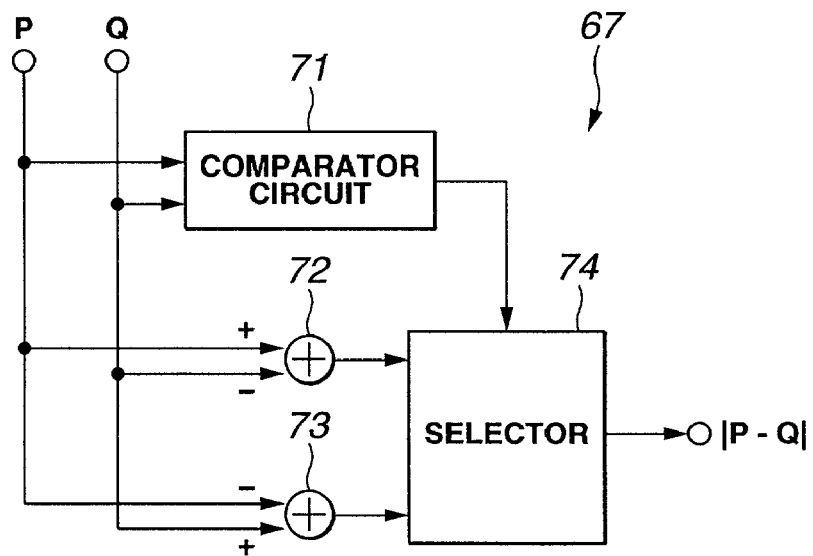
FIG. 15 is a schematic block diagram of the absolute value computation circuit of the addition/comparison/selection circuit of FIG. 14, illustrating the circuit configuration.

Firstly, the delay of the absolute value computation circuit 67 will be estimated. As shown in FIG. 15, the absolute value computation circuit 67 is so regarded as to comprise a comparator 71 for comparting the two values output from the upstream two adders 61, 62 to see which is larger, a pair of differentiators 72, 73 for determining the difference of the two data and a selector 74 for selecting one of the outputs of the differentiators 72, 73.

More specifically, the absolute value computation circuit 67 compares the data P fed from the adder 61 and the data Q fed from the adder 62 by means of the comparator circuit 71. At the same time, the absolute value computation circuit 67 determines the difference (P−Q) of the data P and the data Q by means of the differentiator 72 and also the difference (Q−P) of the data Q fed from the adder 62 and the data P fed from the adder 61 by means of the differentiator 73. Then, the absolute value computation circuit 67 selects either the difference (P−Q) or the difference (Q−P), whichever showing a positive value, by means of the selector 74 on the basis of the information on the outcome of the comparison of the comparator circuit 71 and supplies the selected positive value of either the difference (P−Q) or the difference (Q−P) to the linear approximation circuit 68 as absolute value data |P−Q|.

Thus, as the processing operation of the comparator circuit 71 and that of the differentiators 72, 73 are performed concurrently in the absolute value computation circuit 67, the absolute value computation circuit 67 involves the delay due to an adder and the delay due to a selector.

Figure 16:
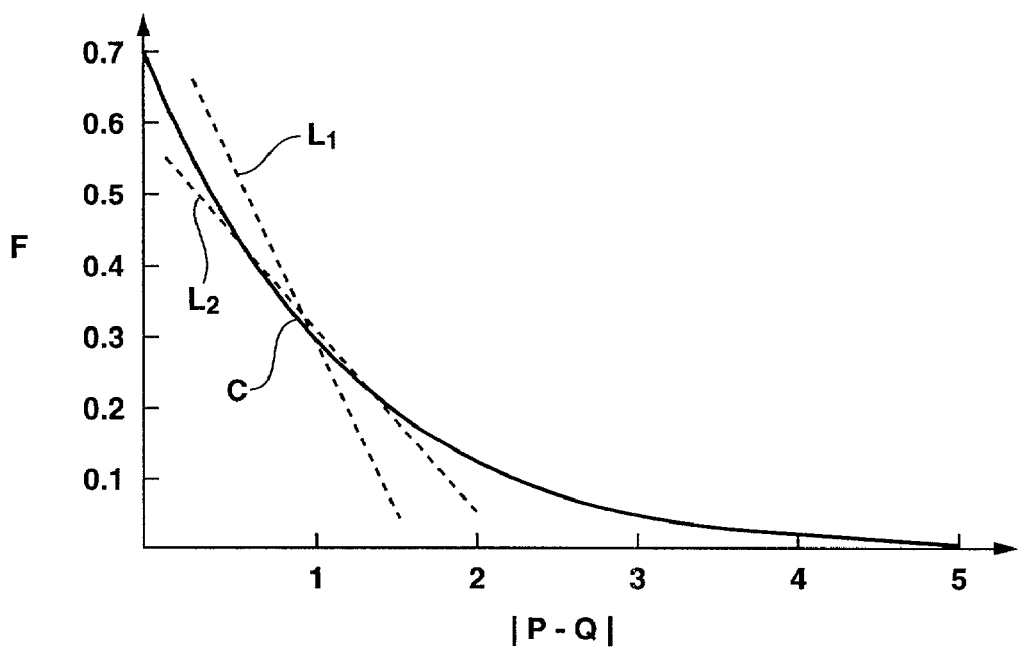
FIG. 16 is a graph showing the relationship between a function having a correction term and a function that can be used by the linear approximation circuit of the addition/comparison/selection circuit of FIG. 14 for linear approximation, illustrating the operation of log-sum correction of the circuit.
Figure 17:
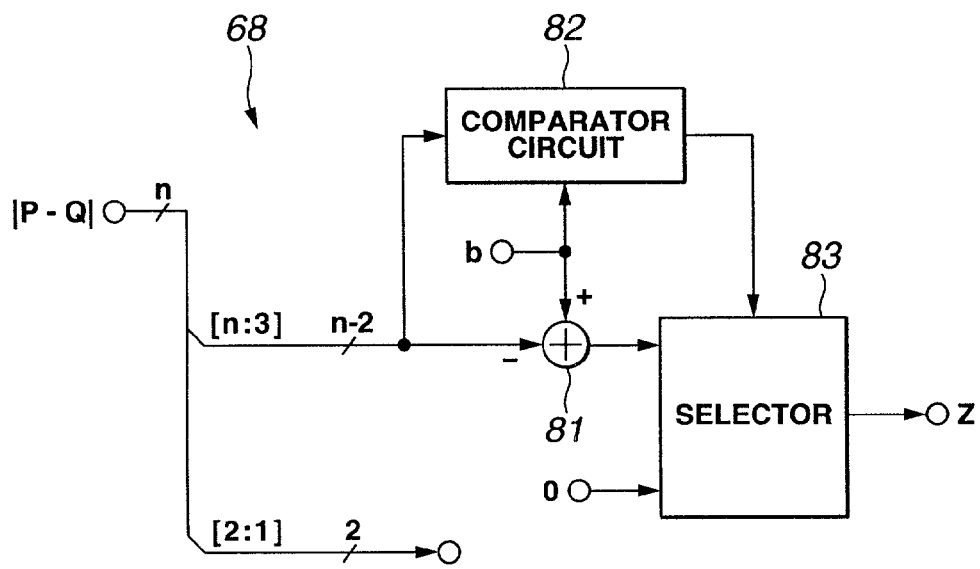
FIG. 17 is a schematic block diagram of a linear approximation circuit that can be used for the purpose of the invention, illustrating the configuration of the circuit for computing the value of the correction term, where the coefficient –a of function F=–a|P–Q|+b is expressed by using a power exponent of 2.

As shown in FIG. 16, the linear approximation circuit 68 performs a log-sum correction by means of so-called linear approximation so as to approximate the function F=−a|P−Q|+b indicated by straight lines $L_1$, $L_2$ to the function F=log {1+e^(−|P−Q|)} indicated by curve C and computes the value of the correction term. More specifically, the linear approximation circuit 68 computes the value of the correction term at least by expressing the coefficient −a of function F=−a|P−Q|+b, using a power exponent of 2. Referring to FIG. 16, −a that is expressed by means of a power exponent of 2 may be −a=−$2^{-1}$=−0.5 as indicated by straight line $L_1$ or −a=−$2^{-2}$=−0.25 as indicated by straight line $L_2$. It is assumed here that −a=−0.25. Then, as shown in FIG. 17, the linear approximation circuit 68 is so regarded as to comprise a differentiator 81, a comparator circuit 82 and a selector 83.

The differentiator 81 computes the difference of the coefficient b representing the intercept of the function F=−a|P−Q|+b and the upper n−2 bits of the n-bit absolute value data |P−Q| fed from the absolute value computation circuit 67 and supplies the selector 83 with the difference.

The computation 82 compares the value of the coefficient b and that of data |P−Q|[n:3] expressed by means of the upper n−2 bits of the absolute value data |P−Q| to see which is larger and supplies the selector 83 with information on the outcome of the comparison.

The selector 83 selects either the data fed from the differentiator 81 or "0" on the basis of the information on the outcome of the comparison coming from the comparator circuit 82. More specifically, the selector 83 selects the data fed from the differentiator 81 when the outcome of the comparison of the comparator circuit 82 proves |P−Q|[n:3] ≦b, whereas it selects "0" when |P−Q|[n:3]>b. Then, the selector 83 supplies the selected data to the differentiator 66 as data Z indicating the value of the correction term.

The linear approximation circuit 68 discards the lowest bit and the second lowest bit of the n-bit absolute value data |P−Q| fed from the absolute value computation circuit 67 and subtracts the data expressed by the remaining upper n−2 bits from the coefficient b. In other words, the linear approximation circuit 68 can multiply |P−Q| by ¼=0.25 by discarding the two lowest bits and bit-shifting the absolute value data |P−Q| and carry out the operation of −0.25 |P−Q|+b by subtracting the data expressed by the remaining upper n−2 bits from the coefficient b.

Since the correction term shows a positive value, the linear approximation circuit 68 outputs "0" by means of the selector 83 and avoids the situation where the correction term takes a negative value if the comparator circuit 82 finds out as a result of the comparison that the differentiator 81 outputs a negative value and hence the value of the correction term is computed as negative.

If −a=−$2^{-1}$=−0.5 is taken, the linear approximation circuit 68 discards the lowest bit of the absolute value data |P−Q| for bit-shifting. Therefore, an appropriate number of lower bits of the absolute value data |P−Q| will be discarded depending on the power exponent to be used for expressing the coefficient −a.

Thus, the linear approximation circuit 68 does not require the use of any multiplier and involves only a processing operation of the differentiator 81 and that of the comparator circuit 82 that proceed concurrently. Therefore, the delay of the linear approximation circuit 68 can be estimated as that of a single adder and that of a single selector.

Figure 18:
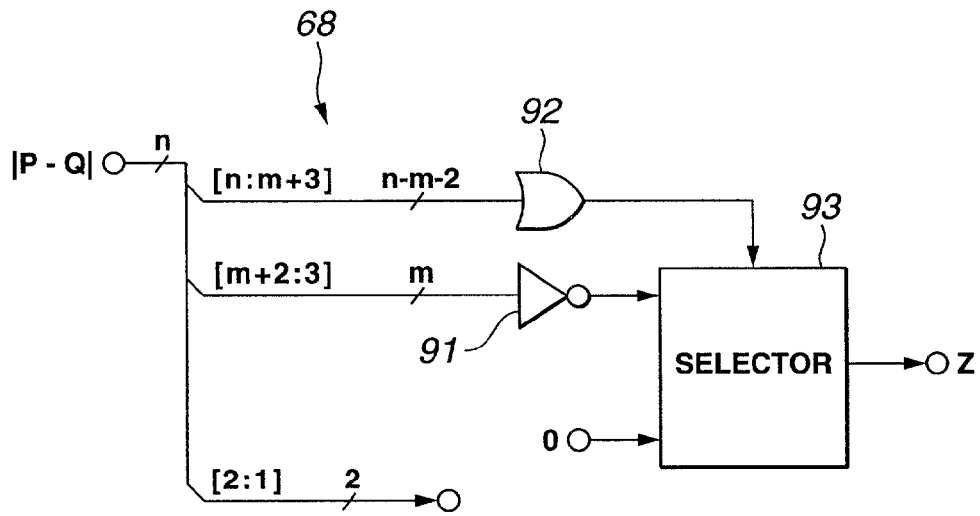
FIG. 18 is a schematic block diagram of another linear approximation circuit that can be used for the purpose of the invention, illustrating the configuration of the circuit for computing the value of the correction term, where the coefficients −a and b of function F=−a|P−Q|+b are expressed by using power exponent of 2.

The linear approximation circuit 68 may compute the value of the correction term also by using a power exponent of 2 to express the coefficient b. If the coefficient b is expressed by means of $2^m-1$ and −a=−0.25, the linear approximation circuit 68 can be so regarded as to comprise an inverter 91, an OR gate 92 and a selector 93 as shown in FIG. 18.

The inverter 91 inverts the in bits from the third lowest bit to the m+2-th lowest bit of the n-bit absolute value data |P−Q| fed from the absolute value computation circuit 67. Then, the inverter 91 supplies the data obtained as a result of the inversion to the selector 93.

The OR gate 92 determines the exclusive OR of the upper n−m−2 bits from the m+3-th lowest bit to the n-th lowest bit of the n-bit absolute value data |P−Q| fed from the absolute value computation circuit 67. Then, the OR gate 92 supplies the obtained exclusive OR to the selector 93.

The selector 93 selects either the data fed from the inverter 91 or "0" on the basis of the exclusive OR fed from the OR gate 92. More specifically, the selector 93 selects the data fed from the inverter 91 when the exclusive OR fed from the OR gate 92 is equal to "0" but it selects "0" when the exclusive OR fed from the OR gate 92 is equal to "1". Then, the selector 93 supplies the selected data to the differentiator 66 as data Z indicating the correction term.

Thus, the linear approximation circuit-68 discards the lowest bit and the second lowest bit of the n-bit absolute value data |P−Q| fed from the absolute value computation circuit 67 and inverts the m bits from the third lowest bit to the m+2-th lowest bit of the remaining upper n−2 bits by means of the inverter 91. At the same time, the linear approximation circuit 68 determines the exclusive OR of the n−m−2 bits from the m+3-th lowest bit to the n-th bit by means of the OR gate 92.

In other words, the linear approximation circuit 68 can multiply |P−Q| by ¼=0.25 by discarding the two lowest bits and bit-shifting the absolute value data |P−Q|. Therefore, the linear approximation circuit 68 only needs to multiply the data |P−Q|[n:3] expressed by means of the upper n−2 bits of the absolute value data |P−Q|, or 0.25 |P−Q|, by −1 and adds the coefficient b that is expressed by means of $2^m-1$ to the product.

Figure 19A:
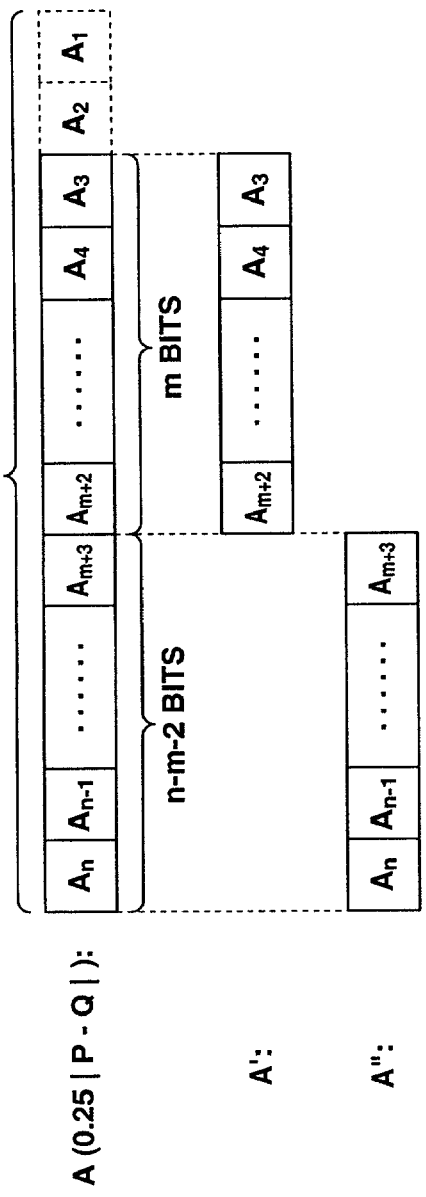
FIGS. 19A and 19B are schematic illustrations of the computational operation of the linear approximation circuit of FIG. 18.

In order to express the arithmetic operations of the linear approximation circuit 68 by modus, 0.25 |P−Q| obtained by discarding the two lowest bits of the n-bit absolute value data |P−Q| is denoted by A=($A_n, A_{n-1}, \ldots, A_{m+3}, A_{m+2}, \ldots, A_3$) and the m bits from the third lowest bit to the m+2-th lowest bit and the n−m−2 bits from the m+3-th lowest bit to the n-th bit of the remaining upper n−2 bits are denoted respectively by A' and A" as shown in FIG. 19A.

Firstly, it is assumed that "−0.25|P−Q|+$2^m$−1=−A+($2^m$−1)" to be obtained by the linear approximation circuit 100 shows a negative value. Then, the equivalence relation as expressed by formula (32) below holds true. More specifically, A" shows a positive value when "−A+($2a^m$−1)" shows a negative value. In other words, the exclusive OR of all the bits of A" is equal to "1" when "−A+($2^m$−1)" shows a negative value.

$$-A + (2^m - 1) < 0 \Leftrightarrow A > 2^m - 1 \quad (32)$$

$$\Leftrightarrow A'' > 0$$

Now, it is assumed that "−0.25|P−Q|+$2^m$−1=−A+($2^m$−1)" to be obtained by the linear approximation circuit 68 shows a value not smaller than 0. Then, A"=0 from the equivalence relation expressed by the above formula (32) and hence formula (33) below holds true.

$$-A+(2^m-1)=-A'+(2^m-1) \quad (33)$$

Figure 19B:
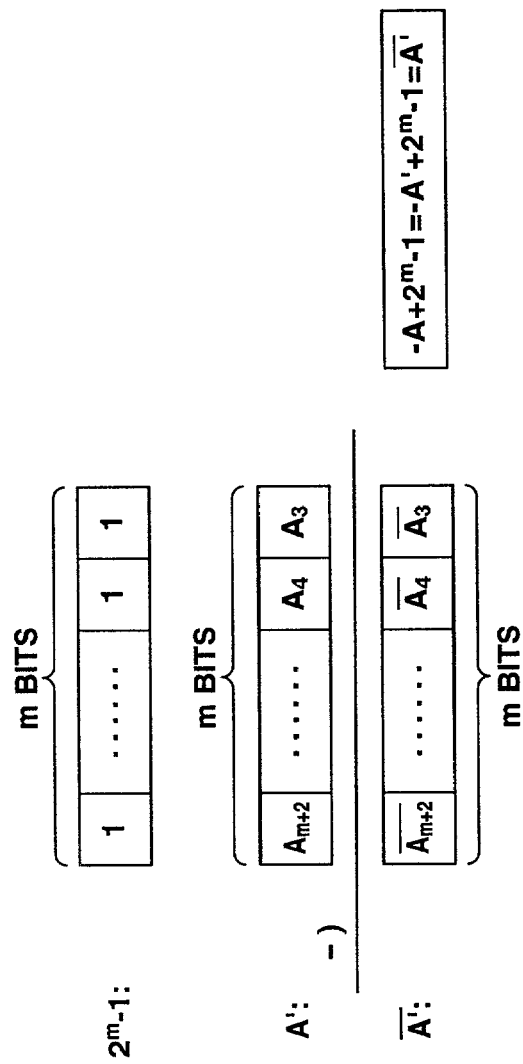

From the fact that $2^{m-1}-1$ refers to a data where all the m bits are equal to "1", "$-A+(2^m-1)$" is expressed by means of the negation of A' as shown in FIG. 19B.

Form the above discussion, it will be seen that the linear approximation circuit 68 only needs to obtain the negation of the lower m bits of A. Therefore, the linear approximation circuit 68 can carry out the operation of "$-0.25|P-Q|+2^m-1$" simply by inverting the data |P-Q|[m+2:2] expressed by means of the m bits from the third lowest bit to the m+2-th lowest bit out of the absolute value data |P-Q| by means of the inverter 91.

Additionally, the linear approximation circuit 68 can see if "$-0.25|P-Q|+2^m-1$" has a positive value or a negative value by obtaining the exclusive OR of the data |P-Q|[m+3:n] expressed by the n-m-2 bits from the m+3-th lowest bit to the n-th bit out of the absolute value data |P-Q|. Therefore, since the correction term shows a positive value, the linear approximation circuit 68 can avoid any situation where the correction term shows a negative value by causing the selector 93 to output "0" when the exclusive OR obtained by the OR gate 92 is "1" and hence the correction term is regarded to show a negative value as a result of computation.

If the coefficient a is expressed by means of $-2^{-k}$, the linear approximation circuit 68 discards the bits from the lowest bit to the k-th lowest bit of the absolute value data |P-Q| for bit-shifting and inverting the m bits from the k+1-th lowest bit to the m+k-th lowest bit. For example, if n=5 and m=2 so that the operation of "$-0.25|P-Q|+3$" is carried out, the absolute value data |P-Q| and the data Z will show the relationship as shown in Table 1 below. Note that Table 1 below additionally shows the above described negation of A', or the data output from the inverter 91.

TABLE 1

Relationship between Absolute Value Data |P-Q| and Data Z

| |P-Q| |  | $\bar{A'}$ | Z |
|---|---|---|---|
| 31 | 11111 | 00 | 0 |
| 30 | 11110 | 00 | 0 |
| 29 | 11101 | 00 | 0 |
| 28 | 11100 | 00 | 0 |
| 27 | 11011 | 01 | 0 |
| 26 | 11010 | 01 | 0 |
| 25 | 11001 | 01 | 0 |
| 24 | 11000 | 01 | 0 |
| 23 | 10111 | 10 | 0 |
| 22 | 10110 | 10 | 0 |
| 21 | 10101 | 10 | 0 |
| 20 | 10100 | 10 | 0 |
| 19 | 10011 | 11 | 0 |
| 18 | 10010 | 11 | 0 |
| 17 | 10001 | 11 | 0 |
| 16 | 10000 | 11 | 0 |
| 15 | 01111 | 00 | 0 |
| 14 | 01110 | 00 | 0 |
| 13 | 01101 | 00 | 0 |
| 12 | 01100 | 00 | 0 |
| 11 | 01011 | 01 | 1 |
| 10 | 01010 | 01 | 1 |
| 9 | 01001 | 01 | 1 |
| 8 | 01000 | 01 | 1 |
| 7 | 00111 | 10 | 2 |
| 6 | 00110 | 10 | 2 |
| 5 | 00101 | 10 | 2 |
| 4 | 00100 | 10 | 2 |
| 3 | 00011 | 11 | 3 |
| 2 | 00010 | 11 | 3 |
| 1 | 00001 | 11 | 3 |
| 0 | 00000 | 11 | 3 |

As shown in Table 1 above, the linear approximation circuit 68 outputs as data Z the data obtained by inverting the data |P-Q|[4:2] as expressed by 2 bits from the third lowest bit to the fourth (2+2=4) lowest bit out of the absolute value data |P-Q| by means of the inverter 91 for the range of the absolute value data |P-Q| between 0 and 12, whereas it outputs "0" for the range of the absolute value data |P-Q| not smaller than 13 because the output of the inverter 91 is negative in the latter range.

Thus, the linear approximation circuit 98 can operate with bit-shifts and an inverter without requiring the use of a multiplier and an adder so that it can be estimated to show the delay of a selector.

Therefore, the delay of the correction term computation circuits 65 is estimated to be equal to that of two adders and two selectors when the correction term computation circuit 68 is made to have the configuration as shown in FIG. 17, whereas the delay of the correction term computation circuit 65 is estimated to be equal to that of an adder and two selectors when the circuits are made to have the configuration of FIG. 18.

Thus, in view of the fact that the processing operation of the comparator circuit 63 and that of the absolute value computation circuit 67 are carried out concurrently, the delay of the addition/comparison/selection circuit 60 is estimated to be equal to that of four adders and three selectors when the linear approximation circuit 68 is made to show the configuration of FIG. 17 and to that of three adders and three selectors when the linear approximation circuit 68 is made to show the configuration of FIG. 18. In other words, while the addition/comparison/selection 60 originally involves the delay of three adders, it can determined the log likelihood IE practically without being affected by the delay of the correction term computation circuit 65.

As described above, a data transmission/reception system comprising an encoder 1 and a decoder 3 can be made to operate quickly without sacrificing the performance because the decoder 3 can quickly determine the correction term when doing a log-sum correction by means of linear approximation.

Thus, such a data transmission/reception system comprising an encoder 1 and a decoder 3 can decode convolutional codes highly effectively at high speed to provide the user with an enhanced level of reliability and convenience.

The present invention is by no means limited to the above described embodiment. For instance, the encoder may not be adapted to convolutional operations so long as it operates for coding with an appropriately selected cording ratio.

Additionally, the present invention is applicable to any arrangement for decoding codes formed by concatenating a plurality element codes such as parallel concatenated convolutional codes, series concatenated convolutional codes, codes of a Turbo-coding modulation system or codes of a series concatenated coding modulation system.

While, the encoder and the decoder of the above described embodiment are applied respectively to the transmitter and the receiver of a data transmission/reception system, the present invention can also be applied to a recording and/or reproduction device adapted to recording data to and/or reproducing data from a recording medium such as a magnetic, optical or magneto-optical disc, which may be a floppy disc, a CD-ROM or a MO (magneto-optical) disc. Then, the data encoded by the encoder are recorded on a recording medium that is equivalent to a memoryless communication channel and then decoded and reproduced by the decoder.

Thus, the above described embodiment can be modified and/or altered

What is claimed is:

1. A decoder for decoding digital information from an encoded input signal received over a communication channel by determining a log likelihood logarithmically expressing a probability of passing a given state on the basis of a received value in the encoded input signal regarded as soft-input and decoding the digital information from said encoded input signal using the log likelihood said decoder comprising:
   an absolute value computation circuit for calculating a variable based on the absolute value of said received value; and
   a linear approximation means for calculating a correction term to be added to the log likelihood, the correction term being expressed in a one-dimensional function relative to said variable;
   said linear approximation means computing said correction term using a coefficient representing a gradient of said function for multiplying said variable, the coefficient being expressed as a power exponent of 2;
   wherein said linear approximation means discards bits from the lowest bit to the k-th lowest bit of the received value when the power exponent expressing the coefficient representing the gradient of said function is expressed by −2−k.

2. The decoder according to claim 1, wherein said linear approximation means computes said correction term using the coefficient representing the intercept of said function, the coefficient being expressed as a power exponent of 2.

3. The decoder according to claim 2, wherein said linear approximation means computes said correction term using the coefficient representing the intercept of said function, the coefficient being expressed as 2m−1.

4. The decoder according to claim 3, wherein said linear approximation means discards the bits from the lowest bit to the k-th lowest bit of the n-bit input data and inverts the m bits from the k-th lowest bit to the m+k-th lowest bit when the coefficient representing the gradient of said function is expressed by means of −2−k.

5. The decoder according to claim 1, wherein said correction term shows a positive value.

6. The decoder according to claim 5, wherein said linear approximation means makes the correction term equal to 0 when a negative value is produced by computing said correction term.

7. The decoder according to claim 1, wherein said log likelihood is a log expression of said probability, using the natural logarithm.

8. The decoder according to claim 1, further comprising:
   a first probability computing means for computing for each received value a first log likelihood logarithmically expressing a first probability determined by a code output pattern and said received value;
   a second probability computing means for computing for each received value a second log likelihood logarithmically expressing a second probability of getting to each state from a coding starting state in the time series;
   a third probability computing means for computing for each received value a third log likelihood logarithmically expressing a third probability of getting to each state from a coding terminating state in the inverted time series; and
   said second probability computing means and said third probability computing means having the linear approximation means.

9. The decoder according to claim 8, further comprising:
   a soft-output calculation means for calculating a log soft-output logarithmically expressing the soft-output in each time slot, using said first log likelihood, said second log likelihood and said third log likelihood.

10. The decoder according to claim 9, wherein said log soft-output is a logarithmic expression of said soft-output, using the natural logarithm.

11. The decoder according to claim 1, wherein said log likelihood is determined by computations replacing multiplications for computing the probability by logarithmic additions and additions for computing the probability by logarithmic maximum value computations and computations of said function.

12. The decoder according to claim 11, wherein a maximum a posteriori probability decoding operation is conducted on the basis of the Log-BCJR algorithm.

13. A decoding method for decoding digital information from an encoded input signal received over a communication channel by determining a log likelihood logarithmically expressing a probability of passing a given state on the basis of a received value in the encoded input signal regarded as soft-input and decoding the digital information from said encoded input signal using the log likelihood, said decoding method comprising:
   an absolute value computation step of calculating a variable based on the absolute value of said received value using an absolute value computation circuit;
   a linear approximation step of calculating a correction term to be added to the log likelihood, the correction term being expressed in a one-dimensional function relative to said variable using a linear approximation circuit;
   computing said correction term using a coefficient representing a gradient of said function for multiplying said variable, the coefficient being expressed as a power exponent of 2; and
   discarding bits from the lowest bit to the k-th lowest bit of the received value when the power exponent expressing the coefficient representing the gradient of said function is expressed by −2−k.

14. The decoding method according to claim 13, wherein said linear approximation step is adapted to compute said correction term using the coefficient representing the intercept of said function, the coefficient being expressed as a power exponent of 2.

15. The decoding method according to claim 14, wherein said linear approximation step is adapted to compute said correction term using the coefficient representing the intercept of said function, the coefficient being expressed as 2m−1.

16. The decoding method according to claim 15, wherein said linear approximation step is adapted to discard the bits from the lowest bit to the k-th lowest bit of the n-bit input data and inverts the m bits from the k-th lowest bit to the m+k-th lowest bit when the coefficient representing the gradient of said function is expressed by means of −2−k.

17. The decoding method according to claim 16, wherein said correction term shows a positive value.

18. The decoding method according to claim 17, wherein said linear approximation step is adapted to make the correction term equal to 0 when a negative value is produced by computing said correction term.

19. The decoding method according to claim 13, wherein said log likelihood is a log expression of said probability, using the natural logarithm.

20. The decoding method according to claim 13, further comprising:
a first probability computing step for computing for each received value a first log likelihood logarithmically expressing a first probability determined by a code output pattern and said received value;
a second probability computing step for computing for each received value a second log likelihood logarithmically expressing a second probability of getting to each state from a coding starting state in the time series;
a third probability computing step for computing for each received value a third log likelihood logarithmically expressing a third probability of getting to each state from a coding terminating state in the inverted time series; and
said second probability computing step and said third probability computing step including the linear approximation steps.

21. The decoding method according to claim 20, further comprising:
a soft-output calculating step for calculating a log soft-output logarithmically expressing the soft-output in each time slot, using said first log likelihood, said second log likelihood and said third log likelihood.

22. The decoding method according to claim 21, wherein said log soft-output is a logarithmic expression of said soft-output, using the natural logarithm.

23. The decoding method according to claim 13, wherein said log likelihood is determined by computations replacing multiplications for computing the probability by logarithmic additions and additions for computing the probability by logarithmic maximum value computations and computations of said function.

24. The decoding method according to claim 23, wherein a maximum a posteriori probability decoding operation is conducted on the basis of the Log-BCJR algorithm.

* * * * *